US008170858B2

(12) United States Patent
Obradovic et al.

(10) Patent No.: US 8,170,858 B2
(45) Date of Patent: May 1, 2012

(54) CHARACTERIZATION AND MODELING OF FERROELECTRIC CAPACITORS

(75) Inventors: Borna Obradovic, McKinney, TX (US); Keith Green, Prosper, TX (US)

(73) Assignee: Texas Instruments Incorporated, Dallas, TX (US)

( * ) Notice: Subject to any disclaimer, the term of this patent is extended or adjusted under 35 U.S.C. 154(b) by 410 days.

(21) Appl. No.: 12/394,849

(22) Filed: Feb. 27, 2009

(65) Prior Publication Data

US 2010/0174513 A1    Jul. 8, 2010

Related U.S. Application Data

(60) Provisional application No. 61/143,096, filed on Jan. 7, 2009.

(51) Int. Cl.
*G06F 17/50* (2006.01)
*G06G 7/62* (2006.01)
*G06G 7/48* (2006.01)

(52) U.S. Cl. ................... 703/14; 703/13; 703/4
(58) Field of Classification Search .................... 703/13, 703/14, 4
See application file for complete search history.

(56) References Cited

U.S. PATENT DOCUMENTS 6,327,558 B1 * 12/2001 Nishimura ...................... 703/20
7,149,137 B2 * 12/2006 Rodriguez et al. ............. 365/201

OTHER PUBLICATIONS

Wei, Chao-gang et al., "A Ferroelectric Capacitor Compact Model for Circuit Simulation", 2004, IEEE.*
Bartic, Andrei, T. et al., "Preisach Model for the Simulation of Ferroelectric Capacitors", Nov. 2, 2000, American Institute of Physics.*
Supriyanto, E., et al., "Ferroelectric Capacitor Compact Model Including Dynamic and Temperature Behavior", 2002, IEEE.*
Miller, S.L., et al., "Device Modeling of Ferroelectric Capacitors", Dec. 15, 1990, American Institute of Physics.*
Clark, Lawrence T., et al., "Integrating Circuit Neural Networks Using Ferroelectric Analog Memory", 1992, IEEE.*
Ando, Bruno, et al., "A New Platform for Modeling Ferroelectric Devices", 2006, IEEE.*
Sheikholeslami, Ali, et al., "A Survey of Behavioral Modeling of Ferroelectric Capacitors", 1997, IEEE.*
Schultz, H., et al., "Modeling Polarization of Ferroelectric SBT Capacitors Including Temperature Dependence", Sep. 27, 2001, Electronic Letters, vol. 37, No. 20.*

(Continued)

*Primary Examiner* — Kandasamy Thangavelu
*Assistant Examiner* — Cedric D Johnson
(74) *Attorney, Agent, or Firm* — Rose Alyssa Keagy; Wade J. Brady, III; Frederick J. Telecky, Jr.

(57) ABSTRACT

Simulation of an electronic circuit including a model of a ferroelectric capacitor. The model of the ferroelectric capacitor includes a multi-domain ferroelectric capacitor, in which each of the domains is associated with a positive and a negative coercive voltage. A probability distribution function of positive and negative coercive voltages is defined, from which a weighting function of the distribution of domains having those coercive voltages is defined. The electrical behavior of the ferroelectric capacitor is evaluated by evaluating the polarization of each of the domains, as weighted by the weighting function. A time-dependent factor can be included in the polarization expression evaluated for each domain, to include the effect of relaxation. The effects of longer-term mechanisms, such as imprint, can be modeled by deriving a probability distribution function for the domains after an accelerated stress.

22 Claims, 9 Drawing Sheets

OTHER PUBLICATIONS

Kuhn, C. et al., "A Dynamic Ferroelectric Capacitance Model for Circuit Simulators", 2001, IEEE.*
Mercey, G. Le Grand de et al., "Relaxation Model for Ferroelectric Capacitors", Apr. 5, 2001.*
Sheikholeslami et al., "A Survey of Behavioral Modeling of Ferroelectric Capacitors", Trans. Ultrasonics, Ferroelectrics, and Frequency Control, vol. 44, No. 4 (IEEE, Jul. 1997), pp. 917-924.
Jiang et al., "Computationally Efficient Ferroelectric Capacitor Model for Circuit Simulation", Digest of Technical Papers, Symposium on VLSI Technology, Paper 10B-4 (IEEE, 1997), pp. 141-142.
Kuhn et al., "A New Physical Model for the Relaxation in Ferroelectrics", Proceedings of the 30th European Solid-State Device Research Conference (IEEE, 2000), pp. 164-167.
Inoue et al., "Effect of Imprint on Operation and Reliability of Ferroelectric Random Access Memory", Trans. Elec. Devices, vol. 48, No. 10 (IEEE, 2001), pp. 2266-2272.
Nozawa et al., "Ferroelectric Dielectric Technology", Proc. of 6th Int'l Conference on Solid-State and Integrated Circuit Technology, vol. 1, (IEEE, 2001), pp. 687-691.

* cited by examiner

CHARACTERIZATION AND MODELING OF FERROELECTRIC CAPACITORS

CROSS-REFERENCE TO RELATED APPLICATIONS

This application claims priority, under 35 U.S.C. §119(e), of Provisional Application No. 61/143,096, filed Jan. 7, 2009, incorporated herein by this reference.

STATEMENT REGARDING FEDERALLY SPONSORED RESEARCH OR DEVELOPMENT

Not applicable.

BACKGROUND OF THE INVENTION

This invention is in the field of simulation of integrated circuits, and is more specifically directed to the simulation of integrated circuits including polarizable ferroelectric capacitors.

Non-volatile solid-state read/write memory devices are now commonplace in many electronic systems, particularly portable electronic devices and systems. A recently developed technology for realizing non-volatile solid-state memory devices is commonly referred to as "ferroelectric RAM", or "FeRAM", or "FRAM". According to this technology, memory cells are realized as capacitors in which the dielectric material is a polarizable ferroelectric material, such as lead zirconate titanate (PZT) or strontium-bismuth-tantalate (SBT). Hysteresis in the charge-vs.-voltage (Q-V) characteristic based on the polarization state of the ferroelectric material, enables the non-volatile storage of information in the FRAM cell. In contrast, conventional dynamic random access memory (DRAM) memories are volatile, because DRAM memory cells use MOS capacitors, with conventional silicon dioxide or silicon nitride dielectrics, that lose their stored charge on power-down of the device.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $V_\alpha$, the capacitor is polarized into the "+1" state. According to this characteristic, once polarized to the "+1" state, so long as voltage V remains above coercive voltage $-V_\beta$, the capacitor will exhibit a stored charge of $+Q_1$. Conversely, if the voltage V applied across the capacitor plates is more negative than coercive voltage $V_\beta$, the capacitor is polarized into the "−1" state, and will exhibit a stored charge of $-Q_2$ for applied voltage V below $+V_\alpha$. Conventional FRAM devices commonly "read" the polarization state of the ferroelectric capacitor in each memory cell by causing a state change, and sensing whether current is output by the capacitor in response. For example, if the capacitor is already in a "+1" polarization state, no current will be output by applying a read voltage above coercive voltage $V_\alpha$; conversely, if the capacitor is in the "−1" polarization state, a current pulse will be produced as the capacitor changes state. This conventional read approach is thus a destructive process, requiring rewriting of the memory cell to replace the previous data state. Recent approaches have been developed that non-destructively read the polarization state of the device.

Simulation of the operation of electronic circuits is a staple task in the design of integrated circuits, even for the most simple of functions but especially as integrated circuit functionality and thus complexity has increased over time. Modern circuit simulation tools not only allow the circuit designer to ensure that the circuit carries out the intended function, but also enable the designer to evaluate the robustness of circuit operation over variations in temperature, signal levels, power supply voltages, and process parameters. A well-known circuit simulation program is the Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

According to SPICE-based circuit simulators, the circuit being simulated is expressed in terms of its elements such as resistors, transistors, capacitors, and the like. Each circuit element is associated with a model of its behavior (i.e., response to voltage or current stimuli), and is "connected" into the overall circuit simulation by specifying the circuit nodes to which it is connected. DC, AC, or transient analysis of the circuit is then performed by specifying any initial conditions (voltages, currents, stored charge etc.), as well as the variable or node of interest, for which the circuit response is to be analyzed. Higher level analysis of the circuit, for example noise analysis, transfer functions, and the like, can also be performed via such simulation.

The models used for semiconductor devices in the simulation can be relative simple circuit-based models, for example corresponding to the well-known Ebers-Moll or Gummel-Poon models. However, models based on device physics have now been derived that determine the device electrical characteristics according to physical parameters such as channel width, channel length, film or layer thicknesses, proximity to other devices, and the like. Such physical models can be correlated or combined with complex empirical electrical models derived from curve fitting to actual device electrical measurements, further improving (at least in theory) the precision with which the behavior of the circuit element can be simulated.

Typically, those device models that are defined largely by device physics parameters are especially useful in "analog" simulation of specific circuit functions, such as sense amplifiers. Other simulations, such as logic simulation of larger functions in the integrated circuit, typically do not require the precision of complex physical and empirical device models.

Examples of conventional models of ferroelectric capacitor behavior are described in Sheikholeslami et al., "A Survey of Behavioral Modeling of Ferroelectric Capacitors", *Trans. Ultrasonics, Ferroelectrics, and Frequency Control*, Vol. 44, No. 4 (IEEE, July 1997), pp. 917-24. Many of these conventional models are directed to models of the behavior of the "saturation" loop, which is generally considered as the switching component of the largest hysteresis loop of the ferroelectric capacitor. FIG. 1 shows such a saturation loop. As known in the art, the ferroelectric material between plates of the capacitor physically includes multiple polarization "domains", analogous to magnetic domains in ferromagnetic material. A domain is a homogenous region of a ferroelectric, in which all of the dipole moments in adjacent unit cells have the same orientation. The saturation loop is thus the Q-V hysteresis characteristic that describes the polarization of all of the ferroelectric domains within the capacitor in the same direction. As described in the Sheikholeslami et al. article, a hyperbolic tangent (tan h) function is a good approximation for the shape of the transition regions of the saturation loop.

By way of further background, the "distributed threshold switching model" described in the Sheikholeslami et al.

article models ferroelectric capacitor polarization behavior over a large number of dipole domains. More specifically, this approach uses a Gaussian distribution of polarization over these domains, with the coercive voltage $V_c$ characterized by a mean value and standard deviation. From a circuit standpoint, this model treats the ferroelectric capacitance as five parallel circuit elements, including one resistor, one linear capacitor, and three non-linear capacitors. One of the non-linear capacitors represents the switching polarization of the ferroelectric capacitor, and is modeled by two Gaussian distributions of polarization versus voltage, representative of the multiple domains. One of the Gaussian distributions has a mean at the positive coercive voltage $+V_\alpha$ to the "+1" state, while the other has a mean at the negative coercive voltage $V_\beta$ to the "−1" state. The extent to which domains are polarized by a positive transition of a modeled applied voltage is defined by the Gaussian distribution of the positive coercive voltage $V_\alpha$.

By way of further background, Jiang et al., "Computationally Efficient Ferroelectric Capacitor Model for Circuit Simulation", *Digest of Technical Papers, Symposium on VLSI Technology*, Paper 10B-4 (IEEE, 1997), pp. 141-42, describes a multi-domain ferroelectric capacitor model that accounts for the history dependence of polarization for applied voltage levels below the coercive voltages. As known in the art, applied voltages below the coercive voltages tend to reduce the overall polarization of the capacitor. According to this model, the outer saturation loops are approximated by way of a tan h function of applied voltage, as in the Sheikholeslami et al. article. If lower magnitude voltages, between the coercive voltages, are then applied to the capacitor, some but not all of the domains will switch their polarization to the opposite state, and the overall Q-V characteristic changes accordingly. In short, the amount of charge stored by the remanent polarization in the device is reduced. According to the Jiang et al. approach, the history of these lower applied voltages applied to the capacitor is modeled by transformation of the tan h approximation of the outer saturation loops to define minor polarization loops lying within the outer saturation loop. More specifically, the Jiang et al. model identifies "turning points" in the Q-V characteristic over time, corresponding to changes in direction (i.e., changes in sign of dV/dt). The Q-V minor loop connecting two turning points is then defined by calculating a slope and intercept by way of which the outer saturation loop tan h function can fit the two turning points. As a result, the minor loops maintain the tan h shape, but fit the initial conditions at the turning points.

As known in the art, ferroelectric capacitors are vulnerable to various physical degradation mechanisms that appear as undesirable changes in the Q-V characteristics of the capacitors. While the electrical behavior of ferroelectric capacitors is complicated to model even without these degradation effects, as evident from conventional SPICE-related models such as described in the Sheikholeslami et al. and Jiang et al. articles, it is especially difficult to model that complex electrical behavior as it degrades over time and voltage history. The models described in the Sheikholeslami et al. and Jiang et al. articles in fact do not address time-dependent or stress-dependent effects.

One of these degradation mechanisms, referred to in the art as relaxation, is the loss of polarization over time in the absence of an applied external field. FIG. 2a illustrates the effect of relaxation on an example of a ferroelectric capacitor, by way of curves 2+ and 2−, illustrating the loss of polarization from the "+1" and "−1" states, respectively. The loss of polarization due to the relaxation mechanism appears as a loss of stored charge by the capacitor. For example, a ferroelectric capacitor polarized to a "+1" state but that undergoes relaxation under the absence of bias, for a sufficient time, can lose polarization and thus stored charge by an amount ΔP between the full "+1" state and curve 2+. Curve 2− shows the effect of relaxation from the "−1" polarization states. Typically, the coercive voltages $V_\alpha$ and $V_\beta$ do not typically shift due to relaxation, to any substantial extent. The loss of polarization due to relaxation in FRAM memory cells increases the likelihood of a read error, because the loss of charge is reflected directly in a reduction in the output current from the cell.

Another degradation mechanism is referred to in the art as "imprint", which is an "end-of-life" mechanism for ferroelectric devices. In contrast to the effects of relaxation generally disappear upon repolarization of the capacitor, imprint is exhibited by permanent shifts in the shape of the hysteresis loop, generally appearing as flattened slopes in the transition curves and shifting in the polarization charge levels that result in an overall loss of area within the hysteresis loop. One type of imprint, referred to as "dynamic" imprint, results from repetitive or extended application of voltage exceeding one of the coercive voltages $V_\alpha$ or $V_\beta$, as the case may be, which effectively rewrites the same data in the cell. Imprint of the static type refers to permanent shifts in the polarization characteristic due to the capacitor remaining in one polarization state over time without external bias. FIG. 2b illustrates the effect of imprint on the Q-V characteristic of an example of a ferroelectric capacitor, by way of shifted characteristic curve 4. In this somewhat extreme case, the effects of imprint include inadequate polarization of the capacitor in either state, as well as poorly defined coercive voltages. Not only does imprint result in data storage errors for ferroelectric capacitors used as FRAM memory cells, but the effects of imprint also disrupt the small signal behavior of ferroelectric capacitors that may be implemented as capacitors in analog circuits and the like.

Rigorous simulation of integrated circuits including ferroelectric devices necessitates consideration of the effects of relaxation and imprint. For example, proper consideration of relaxation and imprint is appropriate in designing sense amplifiers with sufficient margin for ferroelectric capacitors that have lost polarization due to relaxation or imprint. In the SPICE model context, therefore, it is useful to derive ferroelectric capacitor models that are responsive to time and voltage histories of the capacitor in producing Q-V models that can accurately predict the behavior of actual devices as a result of these effects.

By way of further background, Kühn et al., "A New Physical Model for the Relaxation in Ferroelectrics", *Proceedings of the 30th European Solid-State Device Research Conference* (IEEE, 2000), pp. 164-67, describes the inclusion of relaxation effects into the Jiang et al. model. More specifically, the Kühn et al. article describes the calculation of artificial turning points that are a function of elapsed waiting time. These turning points are used to define additional minor loops in the Q-V characteristic, again by calculating a slope and intercept so that the tan h approximations of the outer saturation loops are fit to the artificial turning points and thus define the minor loops.

It has been observed, in connection with this invention, that the treatment of relaxation and imprint effects by conventional ferroelectric capacitor models are limited in their accuracy, relative to the stringent demands of modern integrated circuit design requirements. For example, while the Kühn et al. article describes a model for relaxation effects, that approach is constrained to a model in which the minor loops necessarily have a tan h shape. No physical basis is presented to support the supposition that the minor loops will have such a shape after relaxation, much less correspond to changes in the saturation loop due to imprint.

Other limitations of conventional ferroelectric capacitor models that have been observed, in connection with this invention, include the limited ability of those models to match experimental data regarding the minor loops of the polarization characteristic, especially over a relatively wide range of input signals. The effects of relaxation or imprint, and of the pulse-width dependence of capacitor performance, are also not well-incorporated into conventional models.

As such, the accuracy of simulations of modern FRAM devices or large-scale logic circuits including ferroelectric memory has been limited. This inaccuracy in simulation can lead, in the worst case, to errors in the operation of the designed integrated circuit. To avoid such errors, fabrication and electrical testing of actual ferroelectric devices is necessary to validate integrated circuit design. Typically, multiple design iterations and extensive costly testing is necessary to optimize the circuit design for actual device behavior. While the prudent designer, aware of the limitations of the FRAM model, can avoid circuit failure by designing sufficient operating margin into the circuit, such design overkill will not have optimum performance or efficiency, and can be unnecessarily costly in integrated circuit chip area.

BRIEF SUMMARY OF THE INVENTION

This invention provides a method of modeling ferroelectric capacitors, a method of simulating circuits including ferroelectric capacitors, and computer-readable media encoded with a computer program that, when executed, causes a computer to carry out such methods, in which changes in the polarization characteristic of the ferroelectric capacitor can be accurately modeled.

This invention also provides such a method and media in which the behavior of the modeled ferroelectric capacitor can be accurately characterized.

This invention also provides such a method and media in which the behavior of the modeled ferroelectric capacitor is parameterized to facilitate calibration of the model with electrical measurements of physical ferroelectric devices.

Other advantages of this invention will be apparent to those of ordinary skill in the art having reference to the following specification together with its drawings.

This invention may be implemented into a computerized approach to modeling a ferroelectric capacitor, and to simulating the operation of a circuit including such a modeled ferroelectric capacitor, in which the ferroelectric capacitor is modeled by a large number of independent domains. Each domain has a polarization characteristic, with its own positive and negative coercive voltages. A probability distribution of the positive and negative coercive voltages of the multiple domains, including the degree of correlation between the positive and negative coercive voltages, is defined based on physical measurement and characterization. The model of the capacitor then evaluates the charge stored by the capacitor as a superposition of the charge stored by each domain, with each domain's charge evaluated as a function of its current polarization state and of the applied voltage.

According to another aspect of the invention, relaxation effects can be included in the model, by way of a time-dependent multiplicative factor associated with each domain. The time variable corresponds to the time over which the applied voltage is between the positive and negative coercive voltages for that domain. This multiplicative factor may also be a function of the coercive voltage themselves. Application of a voltage at or in excess of the coercive voltage resets the relaxation time and returns the domain to full polarization in the corresponding direction.

According to another aspect of the invention, end-of-life effects such as imprint are incorporated into the model by changing the shape of the probability distribution of the positive and negative coercive voltages of the domains that make up the modeled capacitor.

DETAILED DESCRIPTION OF THE INVENTION

The present invention will be described in connection with particular embodiments, namely as implemented into a model of a ferroelectric capacitor suitable for use in a simulation program such as the Simulation Program with Integrated Circuit Emphasis (SPICE), because it is contemplated that this invention will be especially beneficial when used in connection with SPICE simulations. However, it is contemplated that this invention may be used to model other ferroelectric elements and other complex circuit elements, and in connection with other simulation environments. Accordingly, it is to be understood that the following description is provided by way of example only, and is not intended to limit the true scope of this invention as claimed.

Figure 1:
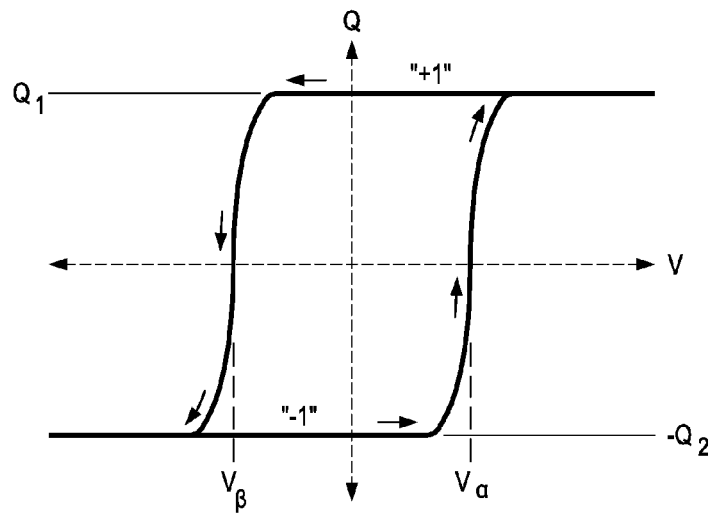
FIG. 1 is a charge-vs.-voltage characteristic of a conventional ferroelectric capacitor.
Figure 2A:
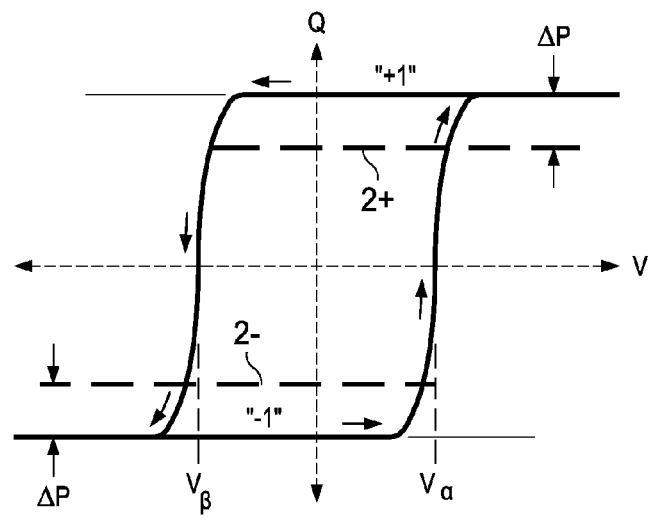
FIG. 2a is a charge-vs.-voltage characteristic of a conventional ferroelectric capacitor, illustrating the effects of relaxation.
Figure 2B:
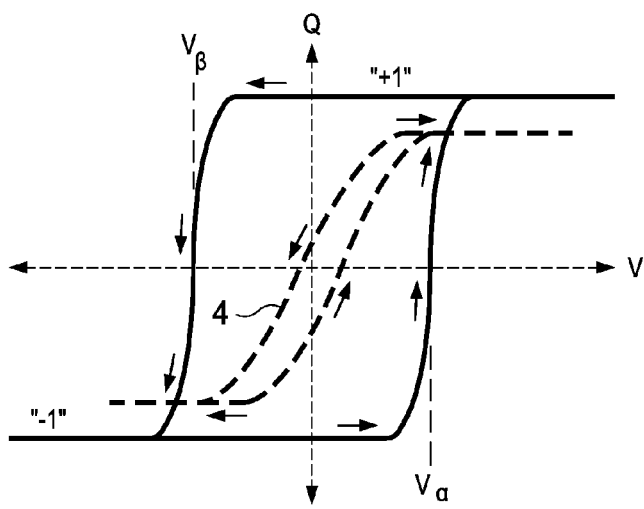
FIG. 2b is a charge-vs.-voltage characteristic of a conventional ferroelectric capacitor, illustrating the effects of imprint.
Figure 3A:
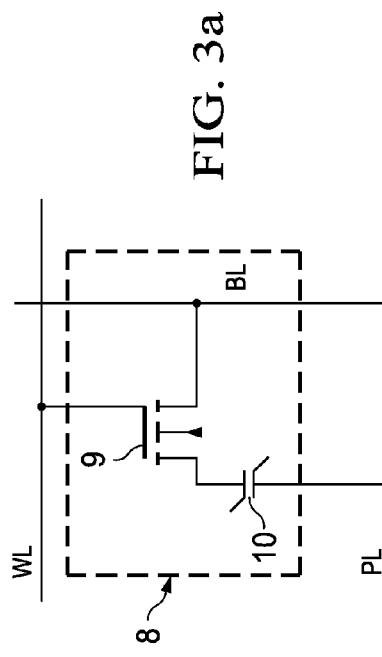
FIG. 3a is an electrical diagram, in schematic form, of a ferroelectric memory cell including ferroelectric capacitor modeled according to embodiments of the invention.

FIG. 3a illustrates ferroelectric random access memory (FRAM) cell 8, within which ferroelectric capacitor 10 is implemented. This embodiment of the invention is directed to modeling of ferroelectric capacitor 10 in a form suitable for circuit simulation, enabling simulation of circuits such as FRAM cell 8. Alternatively, a model of ferroelectric capacitor 10 according to this embodiment of the invention may be used in simulation of other circuits, including analog circuits in which the response of ferroelectric capacitor 10 to small signal variations is simulated. Referring back to FIG. 3a, one plate of ferroelectric capacitor 10 is connected to plate line PL of FRAM cell 8, while the other plate of ferroelectric capacitor 10 is connected to pass transistor 9. Pass transistor 9 has its gate controlled by word line WL, and has its source/drain path connected between ferroelectric capacitor 10 and bit line BL. In operation, an active level on word line WL will turn on pass transistor 9, such that the voltage between bit line BL and plate line PL will appear across ferroelectric capacitor 10. As such, the applied voltage across bit line BL and plate line PL can be used to polarize ferroelectric capacitor 10 into a selected state, and also to apply a sufficient voltage to read the polarization state of ferroelectric capacitor 10 by sensing a current pulse on bit line BL.

Typically, ferroelectric capacitor 10 is physically realized in integrated circuit devices by elements of conductive material, such as patterned portions of a metal (e.g., aluminum, tungsten, alloys, etc.) or doped polysilicon film, with or without cladding, that serve as the upper and lower plates of ferroelectric capacitor 10. A film of ferroelectric material, such as such as lead zirconate titanate (PZT) or strontium-bismuth-tantalate (SBT), among others, is deposited or otherwise formed after the formation of the lower conductive plate and before the formation of the upper conductive plate; photolithographic patterning of this material, along with the plates themselves (either in the same operation or in separate etch operations) defines ferroelectric capacitor 10. Conductive connections to the upper and lower plates of ferroelectric capacitor 10 are made in the conventional manner, depending on the particular technology used to fabricate the integrated circuit containing ferroelectric capacitor 10, and depending on the desired layout of that integrated circuit. It is contemplated that those skilled in the art having reference to this specification comprehend the materials and manufacturing processes appropriate for physical realization of ferroelectric capacitor 10 in a particular integrated circuit.

Theory of the Model

According to this embodiment of the invention, ferroelectric capacitor 10 is modeled by way of multiple components, each representative of a particular electrical response. In general, the behavior of ferroelectric capacitors can be represented by way of a non-ferroelectric capacitor in parallel with a ferroelectric capacitor. In other words, the capacitance of a ferroelectric capacitor includes a component that does not vary with polarization state, along with a component that does so vary. In the example of the modeling representation of ferroelectric capacitor 10 shown in FIG. 3b, this behavior is represented by non-ferroelectric capacitor 12 and multi-domain ferroelectric capacitor 14, connected in parallel with one another between voltage +VA and ground.

According to this embodiment of the invention, the non-ferroelectric component of ferroelectric capacitor 10, represented by capacitor 12, is modeled by way of a non-linear charge-voltage (Q-V) characteristic.

$$Q = C_{min}V + Q_{nfe}\tanh\left(\frac{V - V_0}{V_{sc}}\right)$$

where the parameters $C_{min}$, $Q_{nfe}$, $V_{sc}$, and $V_0$ are determined by experiment and characterization. As evident from this expression, this non-ferroelectric capacitance component is non-linear with voltage, as expressed by the tan h component of the sum, but is independent of polarization state.

Other electrical behavior components that are not dependent on the polarization state can be included in the model of ferroelectric capacitor 10. For example, ferroelectric capacitor 10 can be additionally modeled by including a parallel linear resistor for modeling leakage through ferroelectric capacitor 10, and a parallel linear capacitor for simulating the linear part of electronic and non-switching ionic polarization.

Figure 3B:
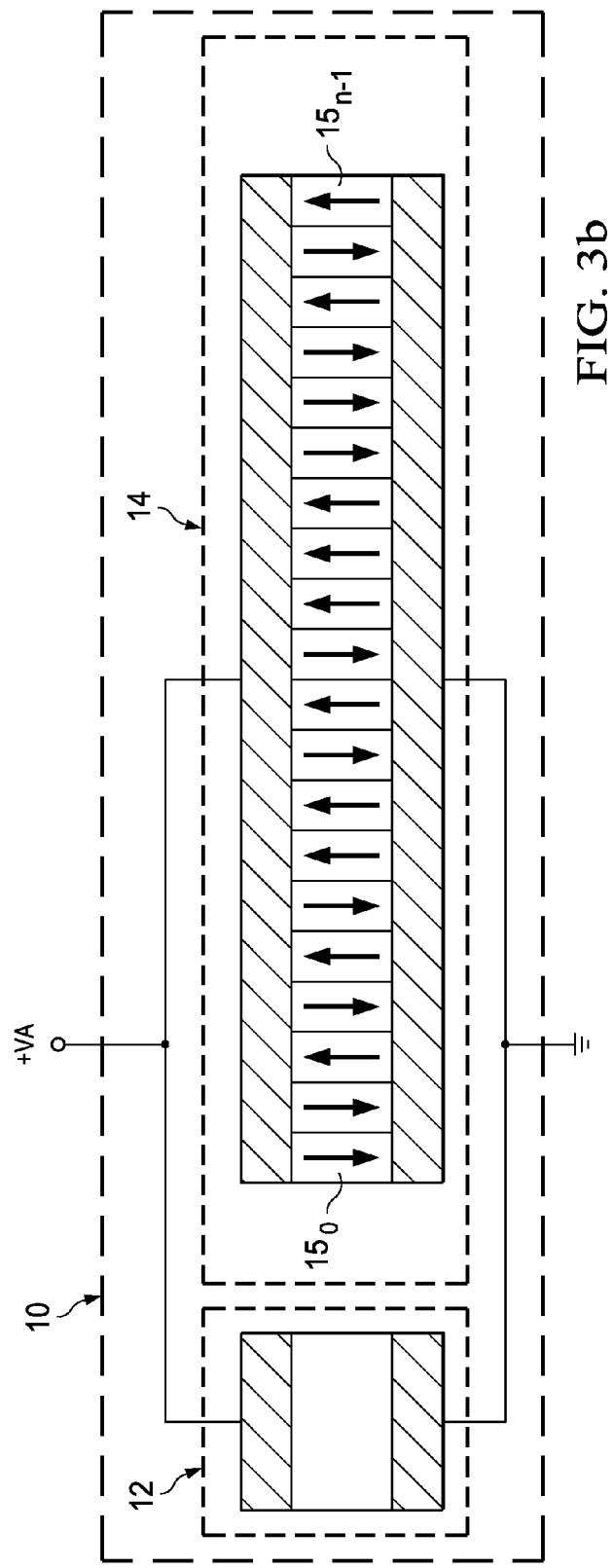
FIG. 3b is a schematic diagram illustrating a model of a ferroelectric capacitor according to embodiments of the invention.

The non-linear switching capacitance resulting from the ferroelectric polarization of ferroelectric capacitor 10 is modeled, according to this embodiment of the invention, by multi-domain ferroelectric capacitor 14, as shown in FIG. 3b. As indicated in FIG. 3b, multi-domain ferroelectric capacitor 14 is considered as n individually and independently polarizable domains $15_0$ through $15_{n-1}$, each of which has a polarization characteristic as if it constituted a ferroelectric capacitor, in and of itself. Because of this independence, domains $15_0$ through $15_{n-1}$ can have different polarization states from one another, depending on the history of voltages applied to ferroelectric capacitor 10, among other factors. As will be described in this specification, the non-linear switching capacitance component of ferroelectric capacitor 10 is modeled as the superposition of these domains $15_0$ through $15_{n-1}$, more specifically as the summation of the polarization of those domains 15. It is contemplated that the number n of domains 15 will be relatively large, for example on the order of 100 or more, to provide reasonable precision and correlation to actual devices.

The Polarization Characteristic

Figure 4:
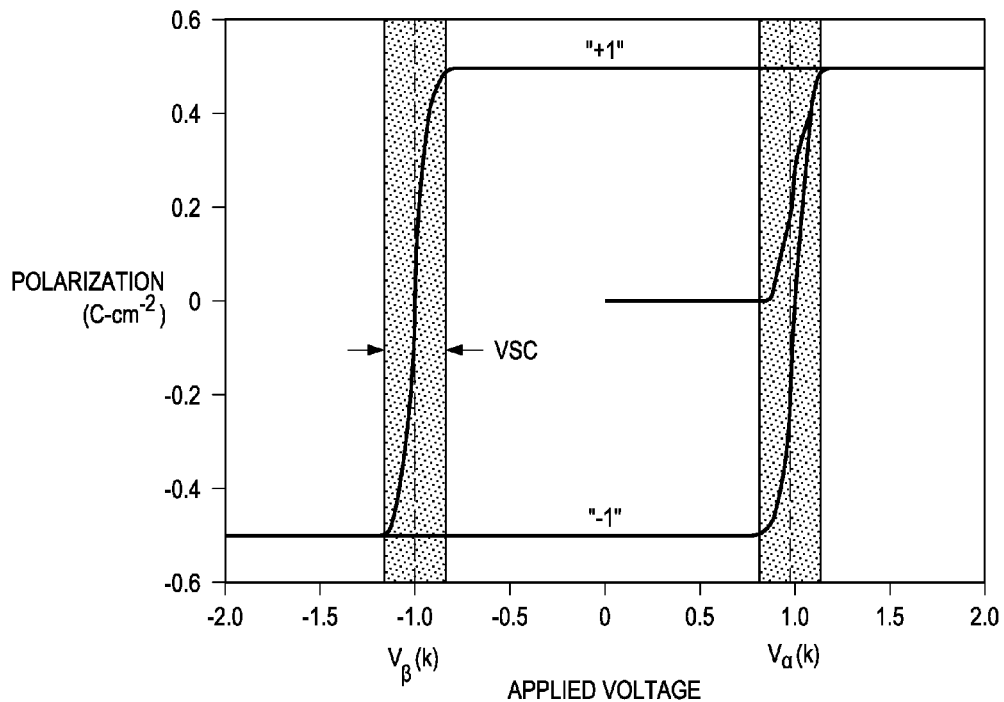
FIG. 4 is a model charge-vs.-voltage characteristic for an individual domain within a multi-domain model of a ferroelectric capacitor, as used in embodiments of the invention.

The polarization characteristic of each of domains $15_0$ through $15_{n-1}$ is a relatively complex function of applied voltage and polarization state, according to this embodiment of the invention. In one example of this embodiment of the invention, the non-linear Q-V characteristic function of this embodiment of the invention is the piece-wise combination of a hyperbolic tangent (tan h) function with a quadratic function. More specifically, the Q-V characteristic function for a given domain is given by a pair of such piece-wise combinations of functions, with the selection of the applicable pair depending on the polarization state of the domain. FIG. 4 illustrates an example of the polarization characteristic of a single domain $15_k$ in the representation of multi-domain ferroelectric capacitor 14 of FIG. 3b. In the each of the "−1" and "+1" polarization states, the "flat" portion of the curve plus the portion of the curve extending from that flat portion to the coercive voltage is represented by a tan h function, with the portion of the curve beginning at the transition point (i.e., at the coercive voltage) and extending to the opposite polarization state represented by a quadratic function (parabola).

For the example of domain $15_k$ represented by the polarization characteristic of FIG. 4, in the "−1" polarization state, the Q-V characteristic can be expressed in terms of the coercive voltage $V_\alpha(k)$ of domain $15_k$ as:

$$Q_k = \theta_{-1} \tanh\left(2\frac{V - V_\alpha(k)}{V_{sc}}\right), \text{ for } V < V_\alpha(k)$$

and $$Q_k = \theta_{-1}\left[1 - \frac{(V - V_\alpha(k) - V_{sc})^2}{V_{sc}^2}\right], \text{ for } V \geq V_\alpha(k)$$

where $V_{sc}$ represents the width of the transition voltage band VSC in FIG. 4, and where $\theta_{-1}$ is a constant term that is non-zero for a polarization state of "−1". Conversely, in the "+1" polarization state, the Q-V characteristic of domain $15_k$ can be expressed in terms of its coercive voltage $V_\beta(k)$ as:

$$Q_k = \theta_{+1} \tanh\left(2\frac{V - V_\beta(k)}{V_{sc}}\right), \text{ for } V > V_\beta(k)$$

and $$Q_k = \theta_{+1}\left[1 - \frac{(V - V_\beta(k) - V_{sc})^2}{V_{sc}^2}\right], \text{ for } V \leq V_\beta(k)$$

where $\theta_{+1}$ is a constant term that is non-zero for a polarization state of "+1". These expressions for the Q-V characteristic of domain $15_k$ essentially mimic the ideal Preisach behavior of ferroelectric capacitors, as known in the art. These expressions provide the precision of finite slope transition regions, and also ensure that the capacitance value varies smoothly across polarization state transitions.

Other expressions of the outer saturation loops of the polarization characteristic can alternatively be used in connection with the model of multi-domain ferroelectric capacitor 14, according to this invention. It is contemplated that the selection of the appropriate outer saturation loop polarization function is best determined by electrical characterization of fabricated ferroelectric capacitors, in the conventional manner.

Figure 5:
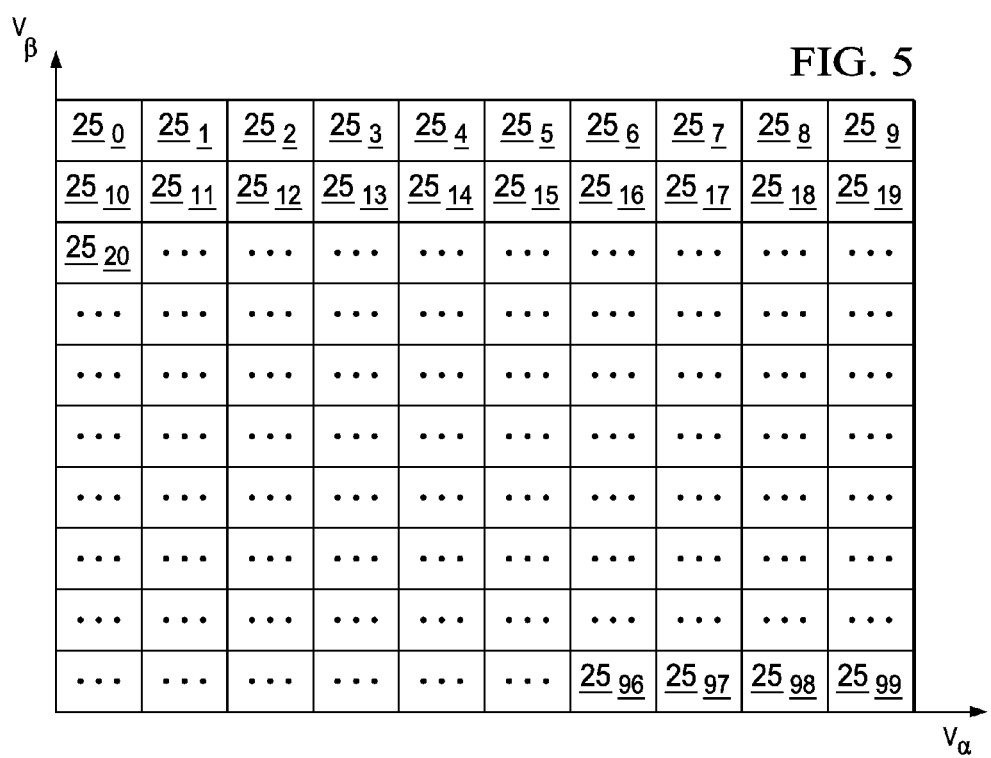
FIG. 5 is a plot illustrating gridcells having varying positive and negative coercive voltages, into which domains of the multi-domain model of a ferroelectric capacitor are assigned, as used in embodiments of the invention.

The domains $15_0$ through $15_{n-1}$ that represent multi-domain ferroelectric capacitor 14 have coercive voltages $V_\alpha$, $V_\beta$ that can vary from one another. According to this embodiment of the invention, the number n of domain 15 is a relatively large number, for example on the order of hundreds. Each domain $15_k$ is associated a combination of a positive coercive voltage level $V_\alpha(k)$ and a negative coercive voltage $V_\beta(k)$. The range of coercive voltage levels $V_\alpha(k)$ and $V_\beta(k)$ assigned to the entire set of n domains 15, in this example, as may be determined by experiment or experience. Cumulatively, the n domains $15_0$ through $15_{n-1}$ provide coverage over the full range of expected coercive voltages $V_\alpha$ and $V_\beta$, as may be represented by a grid of coercive voltage levels $V_\alpha(k)$ and $V_\beta(k)$. An example of such a grid is illustrated in FIG. 5, by way of one hundred gridcells $25_0$ through $25_{99}$ covering an arbitrary expected coercive voltage range. In practice, the desired granularity of the coverage will determine the number of gridcells 25 as well as the extent of the expected range of coercive voltages.

According to this embodiment of the invention, the Q-V characteristic of multi-domain ferroelectric capacitor 14 is modeled by the superposition of the Q-V characteristics of n domains 15 that reside within the gridcells 25 of the coercive voltage grid, such as shown in FIG. 5. The distribution of domains 15 within the various gridcells 25 is weighted by the likelihood that domain $15_k$ having coercive voltage levels $V_\alpha(k)$ and $V_\beta(k)$ is present within the capacitor being modeled. More specifically, the Q-V characteristic of multi-domain ferroelectric capacitor 14 can be expressed as:

$$Q = \sum_{k=0}^{m-1} Q_k(V, X_k) W_k(V_\alpha(k), V_\beta(k))$$

where $W_k(V, \alpha, \beta)$ is a weighting function corresponding to the number of domains 15 that have coercive voltage levels $V_\alpha(k)$ and $V_\beta(k)$ within a given one of m gridcells $25_k$. The function $Q_k$ represents the Q-V characteristic of a single domain 15 as described above relative to FIG. 4; the $X_k$ variable represents the polarization state of domain $15_k$, which as described above selects the correct Q-V equation. According to this embodiment of the invention, all domains 15 that belong to a given gridcell $25_k$ are in the same polarization state as one another, because of the construction of this model.

Figure 6A:
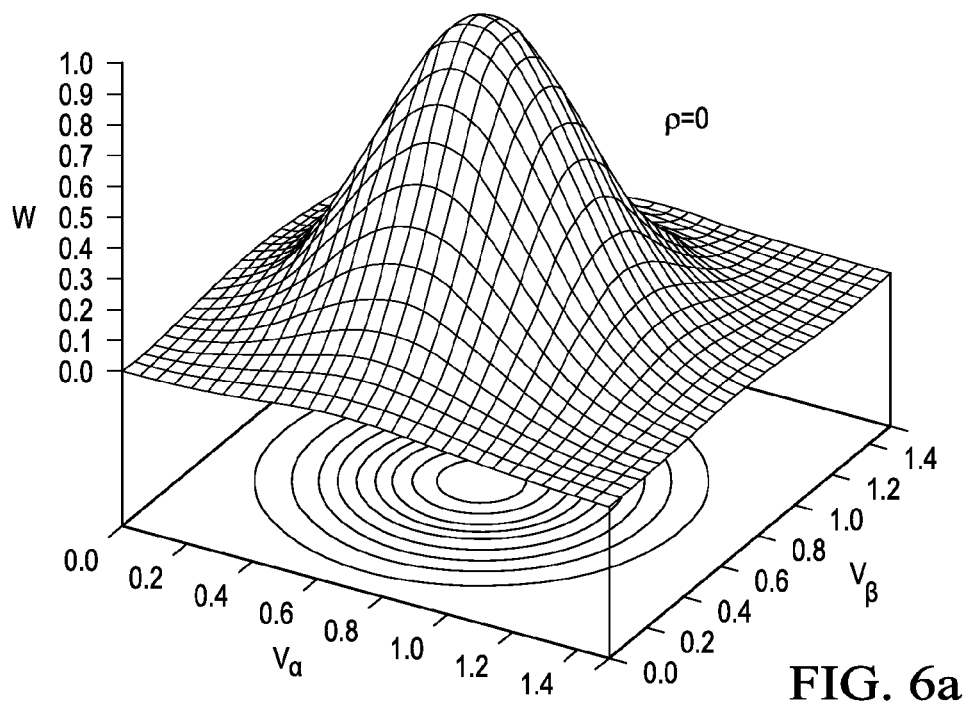
FIGS. 6a and 6b are plots illustrating probability distribution functions of coercive voltages over multiple domains in a modeled ferroelectric capacitor, according to embodiments of the invention.
Figure 6B:
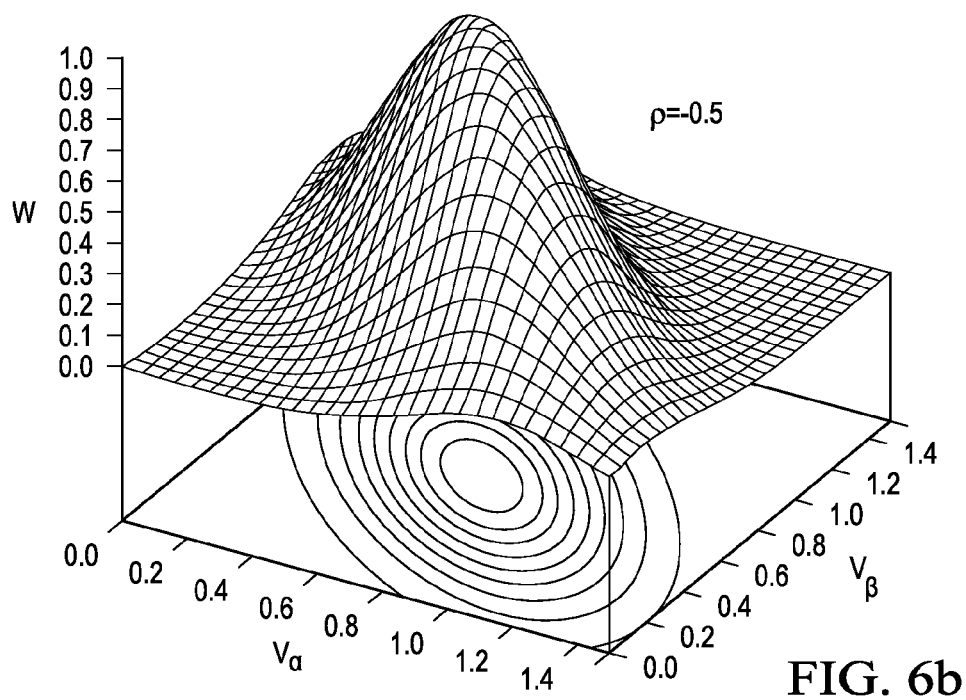

The probability distribution represented by weighting function $W_k$ incorporates the actual physical properties of the ferroelectric capacitor 10 into the polarization determination. FIGS. 6a and 6b illustrate examples of probability distribution function W. In general, the shape and attributes of the probability distribution function W can be determined based on electrical measurement and characterization of the response of actual ferroelectric capacitors. It has been observed, in connection with the invention, that a correlated bi-variate Pearson IV distribution is a good approximation of the probability distribution function W for typical ferroelectric capacitors, where the degree of correlation between coercive voltage levels $V_\alpha$ and $V_\beta$ generally being the determining characteristic of the shape of the function W. According to this type of distribution, one can express the probability distribution function $W_k$ for a given domain $15_k$, with coercive voltage levels $V_\alpha(k)$ and $V_\beta(k)$, as:

$$W_k(V_\alpha(k), V_b(k)) = N \exp\left[-\left(\frac{V_\alpha(k) - V_{\alpha 0}}{\sigma_\alpha}\right)^2 - 2\frac{\rho(V_\alpha(k) - V_{\alpha 0})(V_\beta(k) - V_{b0})}{\sigma_\alpha \sigma_\beta} - \left(\frac{V_\beta(k) - V_{\beta 0}}{\sigma_\beta}\right)^2\right]$$

where $\rho$ is the correlation coefficient of coercive voltages $V_\alpha$ and $V_\beta$, where $V_{\alpha 0}$ and $V_{\beta 0}$ are calibration voltages placing the distribution at the desired place in the $V_\alpha$-$V_\beta$ plane, and where $\sigma_\alpha$ and $\sigma_\beta$ are the standard deviations of the distribution of coercive voltages $V_\alpha$ and $V_\beta$, respectively. FIG. 6a illustrates probability distribution function $W_k$ in the case in which correlation coefficient $\rho$ is zero, and FIG. 6b illustrates probability function $W_k$ in the case in which correlation coefficient $\rho=0.5$.

Of course, other probability distribution shapes may alternatively be used to express weighting function W. It is contemplated that the probability distribution function will generally be dependent on the attributes of the ferroelectric material used to realize ferroelectric capacitor 10, and it is also contemplated that a wide range of possibilities for the shape of these distributions will be encountered. Electrical characterization of the best probability distribution function for a particular ferroelectric material and the process conditions for that material is contemplated to be the preferred approach for defining weighting function W, according to this invention.

Minor Loops

Accordingly, the overall Q-V characteristic of multi-domain ferroelectric capacitor 14 is specified by the superposition of individually polarizable domains with distinct coercive voltages, and a probability distribution function of those domains within a given capacitor structure. The evaluation of the polarization charge on that capacitor 14 is a function of the applied voltage V, and is also a function of the polarization state $X_k$ of each of the domains 15 in the representation (as weighted by the probability distribution function). Because the polarization state $X_k$ of each domain $15_k$ is an input into the Q-V characteristic, the voltage history of capacitor 14 is necessarily incorporated into the modeled Q-V characteristic, in a manner that is not constrained to a particular minor loop shape as in conventional models.

Figure 7:
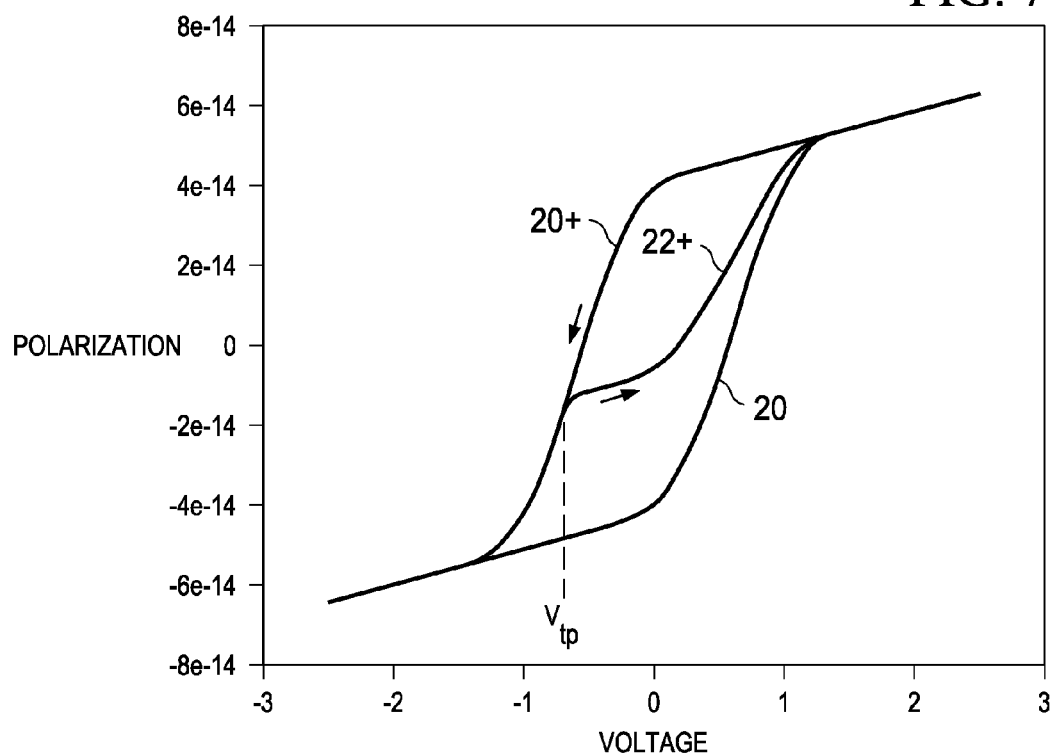
FIG. 7 is a plot illustrating the polarization characteristic of a modeled ferroelectric capacitor, including a minor loop in that characteristic, according to embodiments of the invention.

FIG. 7 illustrates the modeled Q-V characteristic for a multi-domain ferroelectric capacitor 14 according to this embodiment of the invention (in the form of a polarization-vs.-voltage plot; as known in the art, polarization of a ferroelectric capacitor is expressed as charge per unit area). Curves 20+, 20– represent the outer saturation loop of the overall Q-V characteristic of this example of multi-domain ferroelectric capacitor 14, in which the charge Q is based on the sum of contributions from a set of domains 15 that are distributed according to a probability distribution function such as shown in FIGS. 6a and 6b. The outer saturation loop represented by curves 20+, 20– in FIG. 7 constitute the Q-V characteristic for the case in which the applied voltage V exceeds the coercive voltages $V_\alpha$ and $V_\beta$ for all of the domains 15 in the model. As such, curve 20+ illustrates the Q-V characteristic after the application of a voltage sufficiently high to place all domains 15 in the "+1" polarization state, and curve 20– illustrates the Q-V characteristic after the application of a voltage sufficiently negative to place all domains 15 in the "–1" polarization state.

In the case illustrated in FIG. 7, however, a negative-going swing in the applied voltage V falls short of the voltage necessary to saturate the polarization of capacitor 14 into the "–1" state. In this example, the applied voltage is reduced from the "+1" saturation voltage (i.e., about +1.3 volts) to a negative voltage $V_{tp}$ that is less negative than the "–1" saturation voltage; the applied voltage $V_{tp}$ then increases back to the "+1" saturation voltage. In this case, not all of domains 15 are placed into the "–1" polarization state by this negative-going swing. Typically, this lower voltage negative swing, when followed by a positive voltage swing, results in a minor loop (or "inner loop") of the polarization curve.

This model of multi-domain ferroelectric capacitor 14 according to this embodiment of the invention fully accounts for the effects of this lower voltage excursion. As evident from FIG. 7, the polarization of multi-domain ferroelectric capacitor 14 remains on the saturation outer loop 20– upon the voltage reaching turning point voltage $V_{tp}$; it is the change in direction (i.e., change in polarity of dV/dt) that establishes voltage $V_{tp}$ as a turning point. According to this embodiment of the invention, the polarization summation:

$$Q = \sum_{k=0}^{m-1} Q_k(V, X_k) W_k(V_\alpha(k), V_\beta(k))$$

is evaluated at turning point voltage $V_{tp}$, using the polarization state $X_k$=+1 considering that all domains 15 are in the "+1+ polarization state. However, considering that some of the domains 15 (i.e., those with relatively low magnitude negative coercive voltage $V_\beta$) will change polarization into the "–1" state by application of turning point voltage $V_{tp}$, while other domains (i.e., those with relatively high magnitude negative coercive voltage $V_\beta$) will remain in the "+1" state, the polarization characteristic of multi-domain ferroelectric capacitor 14 will deviate from the outer saturation loop 20– as the applied voltage is increased from turning point voltage $V_{tp}$. Therefore, following evaluation of the polarization summation at turning point voltage $V_{tp}$, in this example, the polarization state of those domains 15 for which the turning point voltage $V_{tp}$ is more negative than their negative coercive voltage $V_b$ is changed from "+1" to "–1", and that new polarization state is retained for use in the next evaluation of the polarization summation, for example at any voltage along the new polarization curve 22+ of FIG. 7 (i.e., at subsequent applied voltage levels short of saturation curve 20–). Of course, the number of domains 15 in multi-domain ferroelectric capacitor 14 for which the polarization state flips by application of turning point voltage $V_{tp}$ is determined by the probability distribution function that defines weighting function W, incorporated into the evaluation of the polarization summation.

As evident from this description, the shape of polarization curve 22+ is not constrained to the tan h/quadratic representation of outer saturation loops 20+, 20–. Rather, the extent to which domains 15 within the multi-domain ferroelectric capacitor 14 have their polarization states changed by the application of a voltage between the saturation voltages is determined solely by the probability distribution function incorporated into weighting function W. As a result, because the minor loops in the polarization-vs.-voltage behavior of ferroelectric capacitor 10 can be independently derived (relative to the shape of the outer loops), the resulting model of ferroelectric capacitor 10 can be substantially more accurate than conventional mathematic models described above.

Relaxation Effects

According to another aspect of this invention, the multi-domain ferroelectric capacitor 14 model is capable of accurately incorporating loss of polarization caused by relaxation, as will now be described. As known in the art, relaxation of a ferroelectric capacitor refers to the reduction in remanent polarization that occurs after the passage of time in the absence of an applied voltage, which occurs as the polarized domains tend toward thermal equilibrium. Relaxation effects are distinguishable from imprint, because the lost polarization due to relaxation can be restored by re-application of a coercive voltage, which re-establishes the full polarization level. The effects of imprint, on the other hand, permanently affect the ability of the domains to polarize, regardless of the applied voltage level. As such, relaxation in a ferroelectric capacitor is analogous to the loss of data in a DRAM cell in the absence of a "refresh" operation.

According to this embodiment of the invention, relaxation effects are included in the polarization summation by way of a multiplicative factor that is a time-dependent function. This time-dependent relaxation function r(t) is included in the Q-V calculation of the "flat" portion (e.g., the tan h function) of the characteristic for each individual domain $15_k$, for each of the "+1" and "–1" polarization states:

$$Q_k = \theta_{-1} \cdot r(t) \cdot \tanh\left(2\frac{V - V_\alpha(k)}{V_{sc}}\right), \text{ for } V < V_\alpha(k)$$

for the "−1" state, and $$Q_k = \theta_{-1} \cdot r(t) \cdot \tanh\left(2\frac{V - V_\alpha(k)}{V_{sc}}\right), \text{ for } V < V_\alpha(k)$$

for the "+1" state.

It has been observed that a reasonable expression for relaxation function r(t) is based on an exponential function of time t from full polarization down to an asymptotic value, for example to a final minimum polarization of about 0.70 of the original value (i.e., to a maximum polarization loss due to relaxation of about 30%). According to one example of this embodiment of the invention, relaxation effects are incorporated into the model by considering the fraction of domains 15 within each gridcell 25 of the coercive voltage grid (FIG. 5) that lose their polarization over time, due to relaxation.

Consider $n_{io}$ as the number of domains 15 associated with gridcell $25_i$ that are polarized to a given state prior to any relaxation interval, and $n_{min}$ as the minimum number of domains 15 that retain that polarization state after some arbitrarily long relaxation interval (i.e., the asymptotic number of domains remaining polarized within gridcell $25_i$). In this embodiment of the invention, the number $n_i(t)$ of domains remaining polarized after relaxation time t is given by:

$$n_i(t) = n_{min} + (n_{io} - n_{min})e^{-w_i t}$$

The exponential term $w_i$ is a relaxation time constant that is constructed to reflect the dependence of relaxation on coercive voltage:

$$w_i = \lambda e^{-\frac{V_i^2}{V_{sc}^2}}$$

where λ is a curve-fitting constant, and where $V_i$ is the applicable coercive voltage $V_\alpha$ and $V_\beta$ for gridcell $25_i$, depending on the current polarization state of domains 15 associated with that gridcell $25_i$ ($V_i = V_\alpha$ for domains in the "+1" state, and $V_i = V_\beta$ for domains in the "−1" state). It is contemplated that the parameters for exponential loss of polarization due to relaxation may be determined by electrical characterization of actual ferroelectric capacitors. Based on these expressions, one can express the time-dependent relaxation function r(t) for a given gridcell $25_k$ as:

$$r(t) = \frac{n_i(t)}{n_{io}}$$

This relaxation effect is thus included in the polarization summation over all gridcells 25. Evaluation of the polarization of multi-domain ferroelectric capacitor 14 after time t of no applied voltage can then be performed by way of the weighed (W) sum described above.

Alternatively, it is contemplated that other simpler, or even more complex, expressions for relaxation function r(t) may be derived based on electrical characterization of actual ferroelectric capacitors. It is contemplated that this, and other, physical relationships of relaxation to capacitor and electrical parameters can be incorporated into the relaxation function r(t) by those skilled in the art having reference to this specification.

In any case, the time variable t is contemplated to correspond to the elapsed time of the absence of an applied voltage to ferroelectric capacitor 10. Upon application of a voltage across ferroelectric capacitor 10, additional loss of polarization due to relaxation ceases, but the effect of relaxation on the polarization of the various domains 15 remains until the polarization state of the domains is again written by the application of a coercive voltage.

Figure 8:
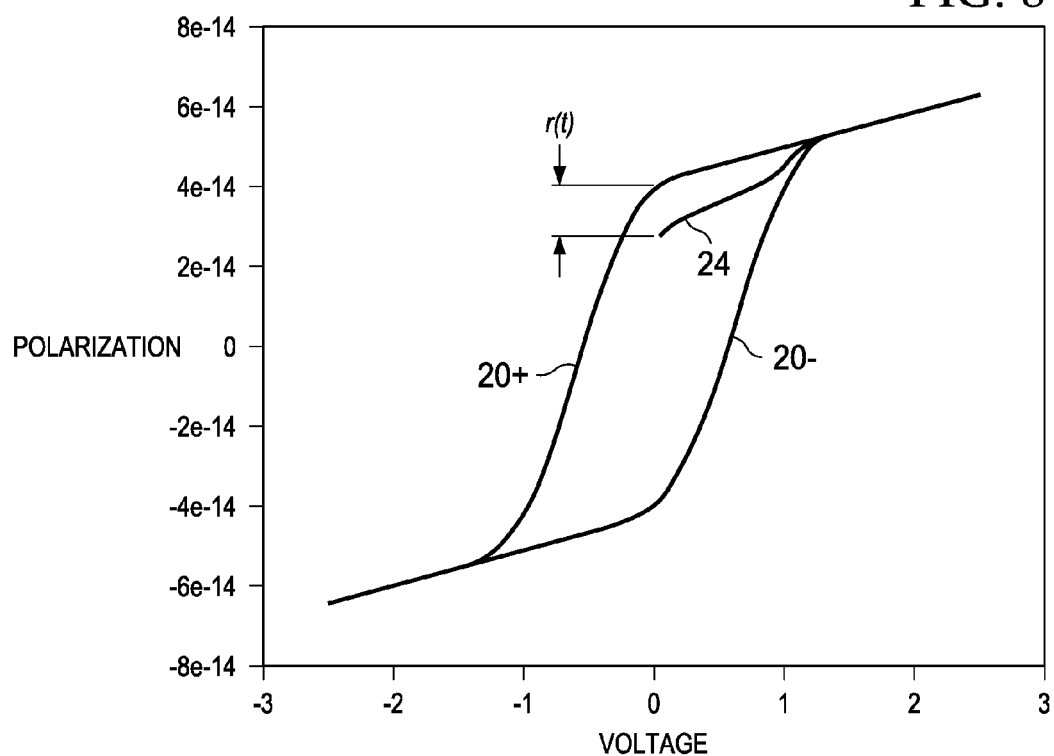
FIG. 8 is a plot illustrating the effect of relaxation in the polarization characteristic of a single domain in the modeled ferroelectric capacitor, according to embodiments of the invention.

FIG. 8 illustrates the relaxation mechanism modeled according to this embodiment of the invention, for the case of loss of polarization due to relaxation from the "−1" state. In the example shown in FIG. 8, the polarization function r(t) represents a loss of polarization of each of the n domains in ferroelectric capacitor 14 from the "−1" polarization state of outer saturation loop 20, for example following the exponential time-dependence described above. The resulting polarization charge from evaluation of the polarization summation, at a particular applied voltage, will lie on polarization curve 24 as shown in FIG. 8 in this example.

It is contemplated that the evaluation of polarization after some substantial elapsed time will define a new minor loop in the Q-V characteristic of multi-domain ferroelectric capacitor 14. Evaluation along this new minor loop will require that any domains 15 that are repolarized to the opposite state are then next evaluated without the effect of relaxation, while other domains 15 that remained in the same polarization state retain their relaxation polarization loss factor r(t).

In addition, it is contemplated that the evaluation of relaxation effects according to this invention need not begin from an outer saturation loop 20+, 20− of the polarization characteristic, but rather can consider the loss of polarization from a minor loop (e.g., from an initial state of minor loop 22+ in FIG. 7). In evaluating the effect of relaxation from a minor loop, those skilled in the art having reference to this specification will recognize that polarization loss due to relaxation will take place from both polarization states as a function of time. The polarization summation described above will readily evaluate relaxation from both polarization states, on a domain-by-domain basis.

Imprint

As discussed above, imprint refers to the reduced ability of domains 15 in ferroelectric capacitor 10 to fully polarize, as a result of the repeated application of coercive voltage ("dynamic" imprint) and from the elapse of time without bias after polarization ("static" imprint). The effects of imprint are permanent to ferroelectric capacitors.

According to embodiments of the invention, imprint is incorporated into the model by changing the shape of the probability distribution function upon which weighting function W is based. The determination of the shape of the probability distribution function after imprint is present (i.e., an "end-of-life" probability distribution function) is contemplated to be based on electrical measurement of the coercive voltages exhibited by a sample of ferroelectric capacitors that are suffering the effects of imprint, either as caused by long-term bias or polarization, or by way of some accelerated test, as will be described in further detail below.

Figure 9A:
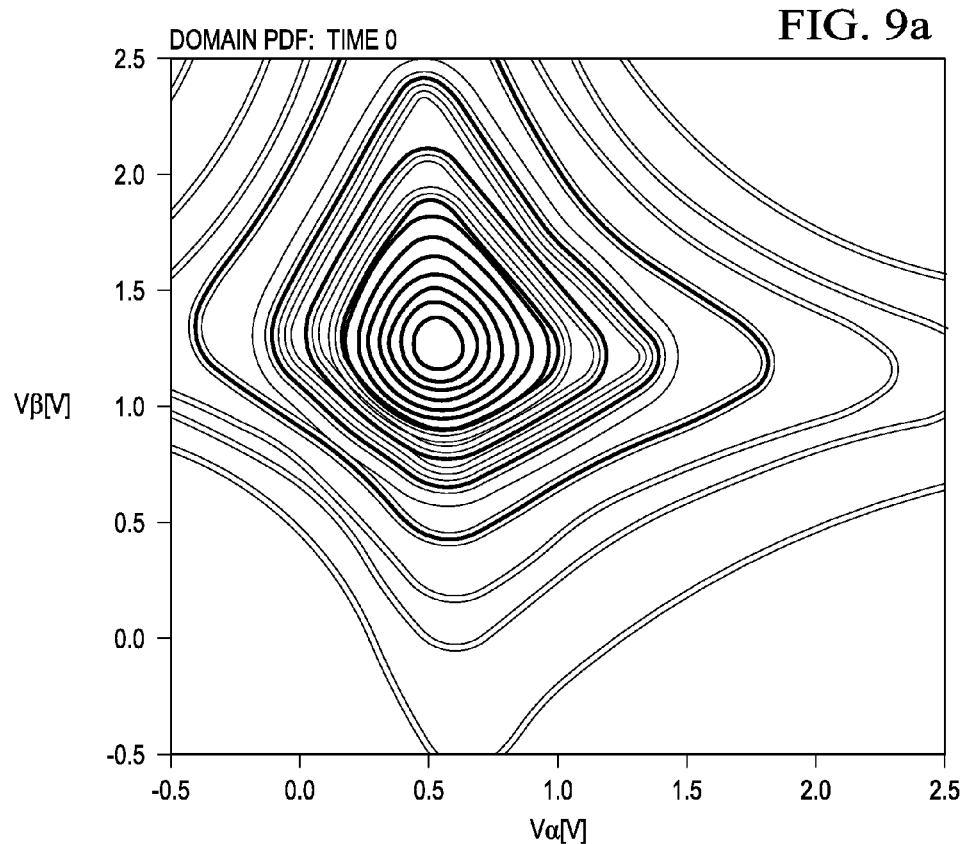
FIGS. 9a and 9b are plots illustrating probability distribution functions of coercive voltages over multiple domains in a modeled ferroelectric capacitor, at an initial time following manufacture and at an end-of-life stage, respectively, according to embodiments of the invention.
Figure 9B:
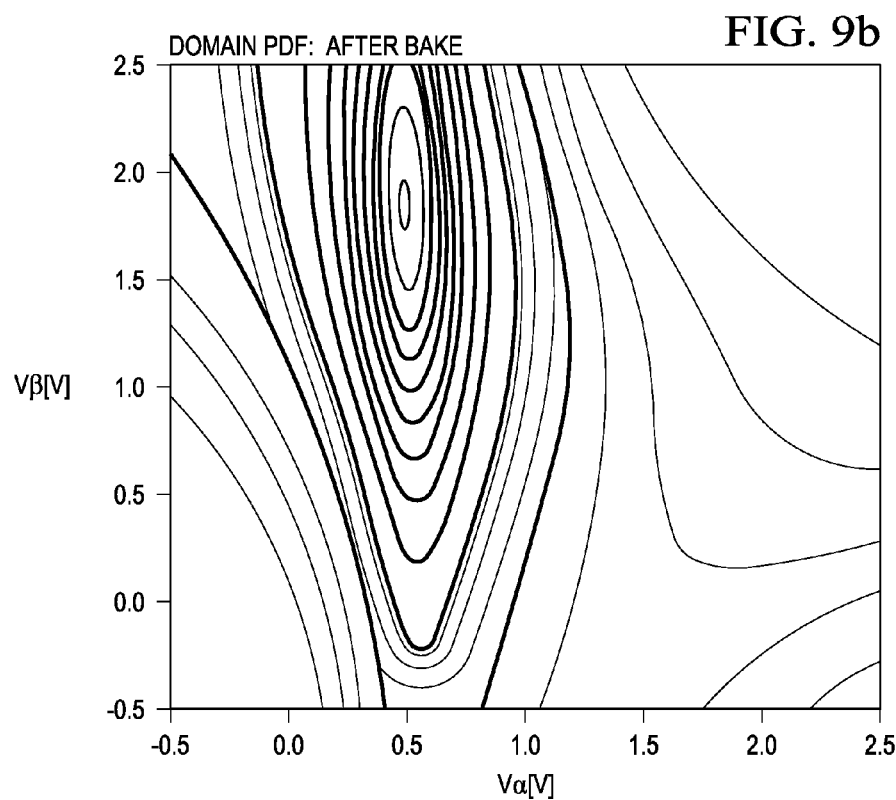

FIGS. 9a and 9b illustrate an example of the change of shape in the probability distribution function due to imprint. In FIGS. 9a and 9b, the curves represent isocontours of probability within the coercive voltage ($V_\alpha$-$V_\beta$) space. An example of an initial post-manufacture probability distribution function of coercive voltages $V_\alpha$, $V_\beta$ is illustrated in FIG. 9a. In this FIG. 9a, the highest likelihood (heaviest weighting W) is at a positive coercive voltage $V_\alpha$, of about 0.55 volts, and at a negative coercive voltage $V_\beta$ of about 1.25 volts (i.e., which will be at −1.25 volts in plots such as FIG. 4). An example of the probability distribution function of coercive voltages $V_\alpha$, $V_\beta$ at the end-of-life for a ferroelectric capacitor is illustrated in FIG. 9*b*. This example of FIG. 9*b* is obtained by way of an accelerated life environment of a high temperature bake applied to a sample of ferroelectric capacitors. As evident from FIG. 9*b*, the probability distribution function of coercive voltages $V_\alpha$, $V_\beta$ shifts from a relatively symmetric distribution to an extremely asymmetric distribution, in which the distribution of negative coercive voltage $V_\beta$ broadens, while the distribution of positive coercive voltage $V_\alpha$ narrows. In addition, the highest likelihood negative coercive voltage $V_\beta$ has shifted, to a voltage of about 1.75 volts, although as mentioned above this distribution is substantially broadened.

Figure 9C:
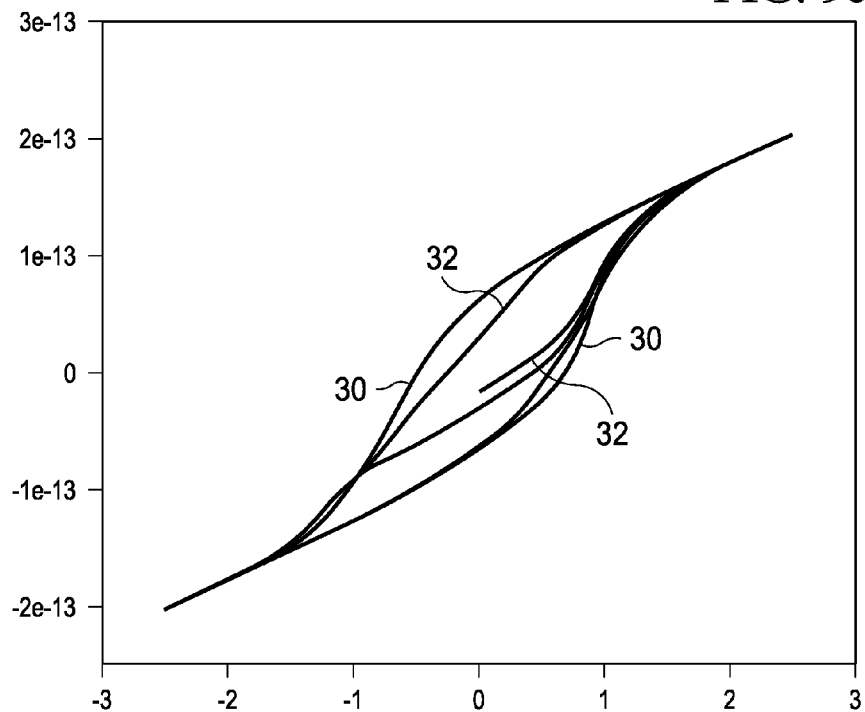
FIG. 9c is a plot of the polarization characteristic of a ferroelectric capacitor illustrating the effects of imprint.

FIG. 9*c* illustrates the effect of the change in probability distribution function on the polarization hysteresis curve. Polarization curve 30 illustrates an example of a time-zero polarization curve for a sample of ferroelectric capacitor 10, while polarization curve 32 illustrates an end-of-life polarization curve for that capacitor, in which the probability distribution function has shifted in the manner described above relative to FIGS. 9*a* and 9*b*. As evident from FIG. 9*c*, the difference in polarization between the two possible states (i.e., the area within the hysteresis loop) is substantially smaller as a result of imprint.

According to this embodiment of the invention, therefore, modeling of ferroelectric capacitor 10 to account for the effects of imprint is easily performed in the same manner as in the case of "time-zero" modeling. The same calculations are performed as described above, but the weighting function W is different when modeling the behavior of ferroelectric capacitor 10 in later life. According to this approach, the behavior of a circuit including ferroelectric capacitor 10 can be simulated to determine its operability and robustness toward the end-of-life of ferroelectric capacitor 10.

Modeling and Simulation System

Figure 10:
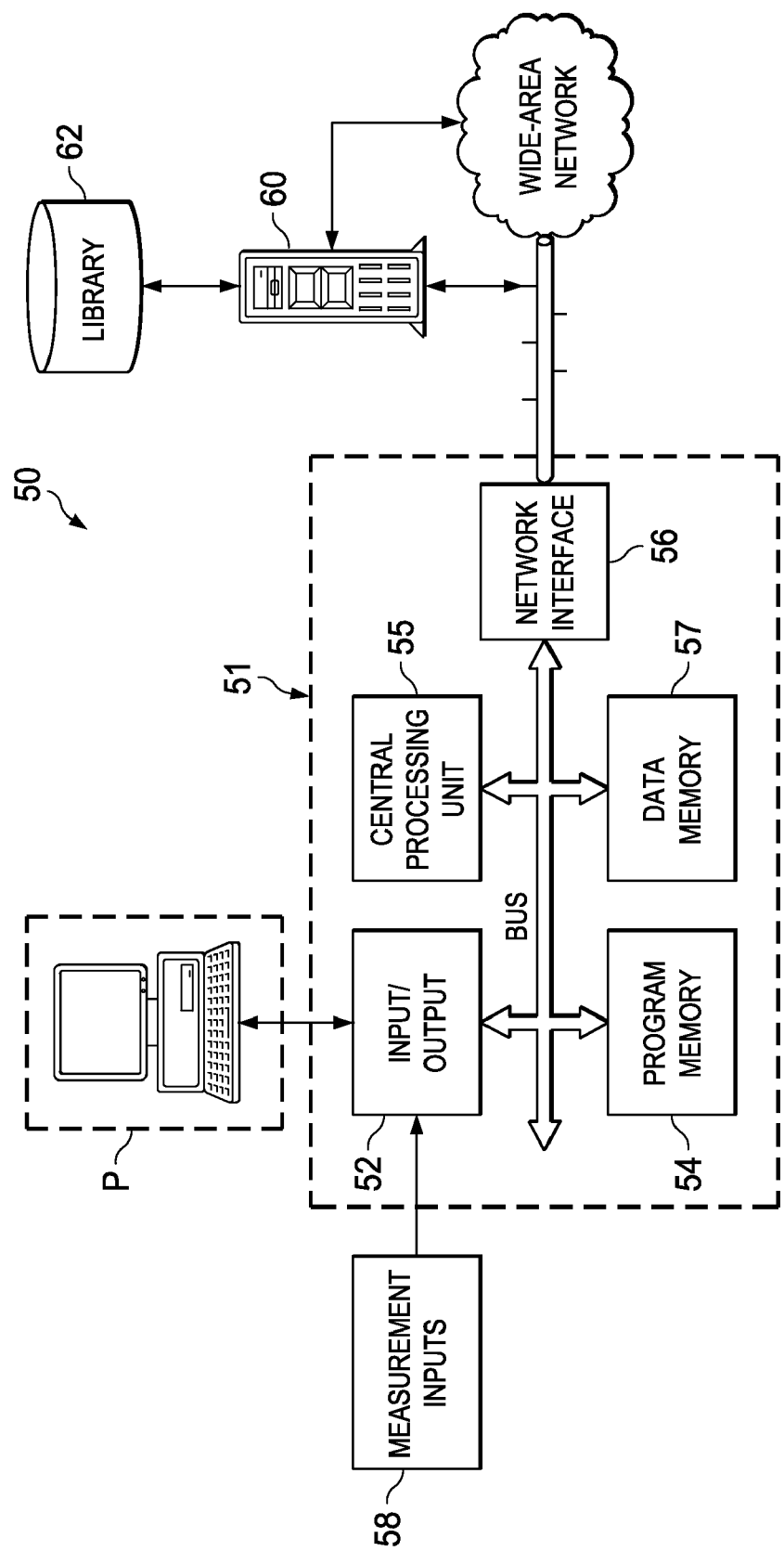
FIG. 10 is an electrical diagram, in schematic form, illustrating a computer system for modeling a ferroelectric capacitor and for simulating an integrated circuit including such a modeled ferroelectric capacitor, according to embodiments of the invention.

According to the foregoing description, the theory of the model used to represent multi-domain ferroelectric capacitor 14 within the parallel component representation of ferroelectric capacitor 10, according to this embodiment of the invention, has been described. Referring now to FIG. 10, computing system 50 for deriving and storing the model, and for applying that model in the simulation of an electronic circuit including ferroelectric capacitor 10, according to embodiments of the invention, will now be described.

FIG. 10 illustrates the construction of modeling and simulation system 50 according to an example of an embodiment of the invention, which performs the operations described in this specification to model ferroelectric capacitor 10 and to simulate the behavior of ferroelectric capacitor 10 in an electronic circuit. In this example, modeling and simulation system 50 is as realized by way of a computer system including workstation 51 connected to server 60 by way of a network. Of course, the particular architecture and construction of a computer system useful in connection with this invention can vary widely. For example, modeling and simulation system 50 may be realized by a single physical computer, such as a conventional workstation or personal computer, or alternatively by a computer system implemented in a distributed manner over multiple physical computers. Accordingly, the generalized architecture illustrated in FIG. 10 is provided by way of example only.

As shown in FIG. 10, workstation 51 includes central processing unit 55, coupled to system bus BUS. Also coupled to system bus BUS is input/output interface 52, which refers to those interface resources by way of which peripheral functions P (e.g., keyboard, mouse, display, etc.) interface with the other constituents of workstation 51. Central processing unit 55 refers to the data processing capability of workstation 51, and as such may be implemented by one or more CPU cores, co-processing circuitry, and the like. The particular construction and capability of central processing unit 55 is selected according to the application needs of workstation 51, such needs including, at a minimum, the carrying out of the functions described in this specification, and also including such other functions as may be desired to be executed by modeling and simulation system 50. In the architecture of modeling and simulation system 10 according to this example, program memory 54 and data memory 57 are coupled to system bus BUS.

Program memory 54 stores the computer instructions to be executed by central processing unit 55 in carrying out those functions. More specifically, program memory 54 is a computer-readable medium storing executable computer program instructions according to which the operations described in this specification are carried out by modeling and simulation system 50, specifically by central processing unit 55 of workstation 51. Alternatively, these computer program instructions may be stored at and executed by server 60, in the form of a "web-based" application, upon input data communicated from workstation 51, to create output data and results that are communicated to workstation 51 for display or output by peripherals P in a form useful to a human user. Data memory 57 provides memory resources of the desired type useful as data memory for storing input data and the results of processing executed by central processing unit 55. Of course, this memory arrangement is only an example, it being understood that data memory 57 and program memory 54 may be included within a unified physical memory resource, or distributed in whole or in part outside of workstation 51. In addition, as shown in FIG. 10, measurement inputs 58 that are acquired from laboratory tests and measurements, or as design parameters, are input via input/output function 52, and stored in a memory resource accessible to workstation 51, either locally or via network interface 56.

Network interface 56 of workstation 51 is a conventional interface or adapter by way of which workstation 51 accesses network resources on a network. As shown in FIG. 10, the network resources to which workstation 51 has access via network interface 56 includes server 60, which resides on a local area network, or a wide-area network such as an intranet, a virtual private network, or over the Internet, and which is accessible to workstation 51 by way of one of those network arrangements and by corresponding wired or wireless (or both) communication facilities. In this embodiment of the invention, server 60 is a computer system, of a conventional architecture similar, in a general sense, to that of workstation 51, and as such includes one or more central processing units, system buses, and memory resources, network interface functions, and the like. Library 62 is also available to server 60 (and perhaps workstation 51 over the local area or wide area network), and stores model calculations, previous model results, actual electrical measurements for use in correlation with current models, and other archival or reference information useful in modeling and simulation system 50. Library 62 may reside on another local area network, or alternatively be accessible via the Internet or some other wide area network. It is contemplated that library 62 may also be accessible to other associated computers in the overall network.

Of course, the particular memory resource or location at which the measurements, library 62, and program memory 54 physically reside can be implemented in various locations accessible to modeling and simulation system 50. For example, these data and program instructions may be stored in local memory resources within workstation 51, within server 60, or in remote memory resources that are network-accessible to these functions. In addition, each of these data and program memory resources can itself be distributed among multiple locations, as known in the art. It is contemplated that those skilled in the art will be readily able to implement the storage and retrieval of the applicable measurements, models, and other information useful in connection with this embodiment of the invention, in a suitable manner for each particular application.

According to this embodiment of the invention, by way of example, program memory 54 stores computer instructions executable by central processing unit 55 to carry out the functions described in this specification, by way of which the behavior of a modeled example of ferroelectric capacitor 10 can be evaluated. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. For example, it is contemplated that the model of ferroelectric capacitor 10 described herein is especially useful when applied to an electronic circuit simulation using a simulation environment based on the well-known Simulation Program with Integrated Circuit Emphasis, commonly referred to as SPICE, originated at the Electronics Research Laboratory of the University of California, Berkeley. Many commercial versions of the SPICE program are now available in the industry, including several versions that are internal or proprietary to integrated circuit manufacturers.

It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or any non-transitory machine readable medium), or downloaded as encoded information on an electromagnetic carrier signal, for example in the form of a software package from which the computer-executable software instructions were installed by modeling and simulation system 50 in the conventional manner for software installation.

Operation of the Model

Characterization of the Model

The operation of modeling and simulation system 50 in carrying out embodiments of this invention will now be described, by way of example. As described above, it is contemplated that variations and alternatives to this method of operation will be apparent to those skilled in the art having reference to this specification, and that such variations and alternatives are encompassed within the scope of this invention as claimed. More specifically, FIGS. 11a and 11b illustrate examples of methods for deriving a model of ferroelectric capacitor 10 at a point in time shortly after its manufacture, and at a point in time near the end-of-life of ferroelectric capacitor 10, respectively.

Figure 11A:
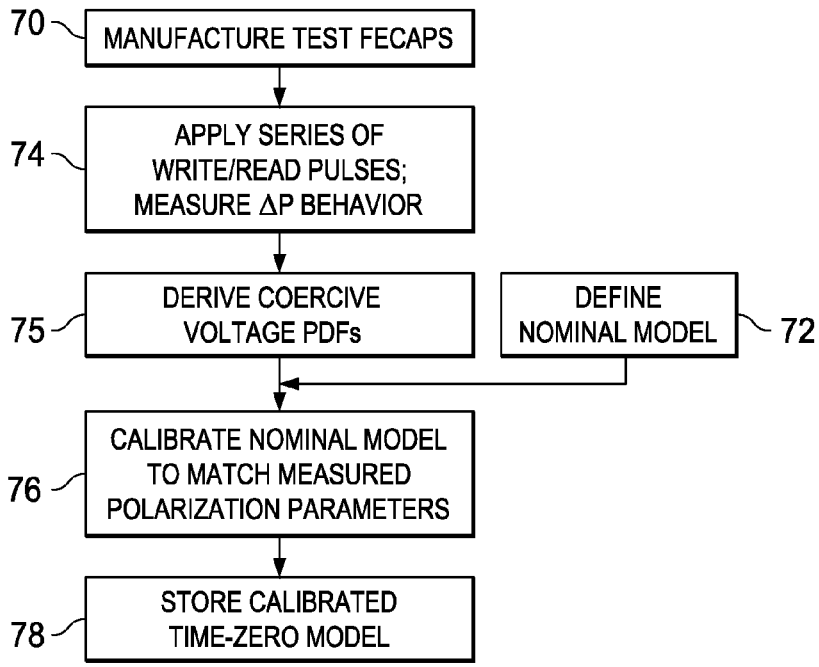
FIGS. 11a and 11b are flow diagrams illustrating the operation of the computer system in defining models of a ferroelectric capacitor according to embodiments of the invention.
Figure 11B:
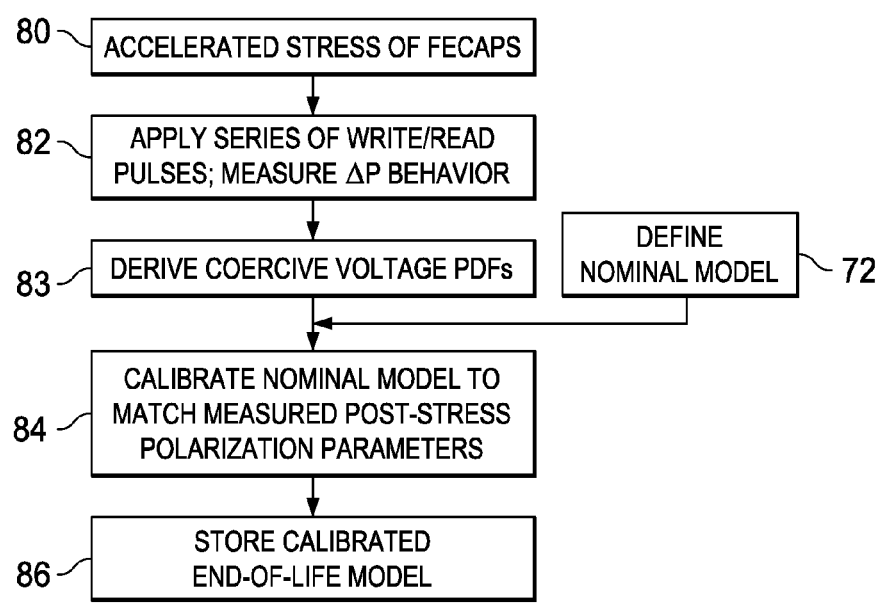

Referring first to FIG. 11a, ferroelectric capacitors for purposes of electrical characterization are manufactured in process 70. As known in the art, these ferroelectric capacitors are intended to resemble ferroelectric capacitor 10 that is the subject of the model or simulation, and as such are preferably fabricated according to a similar manufacturing technology (e.g., using the same ferroelectric polarizable dielectric material), and of similar dimensions in capacitor area and polarizable dielectric thickness. To the extent that the ferroelectric capacitors manufactured in process 70 differ from ferroelectric capacitor 10 that is the subject of the modeling and simulation, the behavioral effect of such differences may be considered by way of extrapolation. Of course, it is contemplated that the fidelity of the model and simulation is improved to the extent that the test ferroelectric capacitors manufactured in process 70 resemble ferroelectric capacitor 10 being modeled.

According to embodiments of this invention, it is useful and efficient to begin the modeling of ferroelectric capacitor 10 from the starting point of a "nominal" polarization model, and then adjusting that nominal model based on the results of measured electrical behavior. Accordingly, in process 72, a nominal model for ferroelectric capacitor 10 is defined and stored in memory of modeling and simulation system 50, for example in data memory 57 or library 62 in the example of FIG. 10.

Following the manufacture of test ferroelectric capacitors in process 70, one or more of test ferroelectric capacitors are electrically exercised in process 74, and their behavior in response to such electrical exercise measured. It is contemplated that any conventional approach to the characterization of ferroelectric capacitors, specifically those approaches intended to measure establish polarization curves including outer saturation loops and minor loops such as shown by way of example in FIGS. 4 and 7, may be used in process 74.

As described above in connection with FIG. 3b, ferroelectric capacitor 10 is modeled according to embodiments of this invention as multiple components in parallel, including non-polarizable capacitor 12 in parallel with multi-domain ferroelectric capacitor 14. As such, measurement process 74 includes electrical measurements of the non-polarizable capacitance and other electrical behavior (leakage, parasitic inductance, etc.) that does not depend on the polarization state of ferroelectric capacitor 10.

Regarding the polarization-dependent behavior of ferroelectric capacitor 10, these effects are modeled by multi-domain ferroelectric capacitor 14 according to embodiments of this invention. As such, the electrical measurement of process 74 provides measurement data that are used by modeling and simulation system 50, in process 75, to derive the probability distribution function of the positive and negative coercive voltages (and correlation factor $\rho$) of multi-domain ferroelectric capacitor 14, for example as shown in FIGS. 6a and 6b. For example, one approach useful in process 74 is to apply a series of write and read pulses to one or more of the test ferroelectric capacitors, by way of which the polarization state written by the write pulses is "read" by measurement of the polarization charge upon application of the read pulses. Changes in polarization of the test ferroelectric capacitors resulting from the application of read pulses of varying voltages and polarities can be used to define minor polarization loops (FIG. 7), and from these minor loops, to define the probability distribution functions of positive and negative coercive voltages such as shown in FIGS. 6a and 6b, in process 75. For example, as described above, the execution of process 75 by system 50 can create a probability distribution function $W_k$ for a given domain $15_k$, with coercive voltage levels $V_\alpha(k)$ and $V_\beta(k)$, as:

$$W_k(V_a(k), V_b(k)) = N \exp\left[-\left(\frac{V_\alpha(k) - V_{\alpha 0}}{\sigma_\alpha}\right)^2 - 2\frac{\rho(V_\alpha(k) - V_{\alpha 0})(V_\beta(k) - V_{b0})}{\sigma_\alpha \sigma_\beta} - \left(\frac{V_\beta(k) - V_{\beta 0}}{\sigma_\beta}\right)^2\right]$$

where $\rho$ is the correlation coefficient of coercive voltages $V_\alpha$ and $V_\beta$, where $V_{\alpha 0}$ and $V_{\beta 0}$ are calibration voltages placing the distribution at the desired place in the $V_\alpha$-$V_\beta$ plane, and where $\sigma_\alpha$ and $\sigma_\beta$ are the standard deviations of the distribution of coercive voltages $V_\alpha$ and $V_\beta$, respectively.

As described above, the model of multi-domain ferroelectric capacitor 14 includes a multiplicative factor that comprehends relaxation of polarization over time without applied voltage. As such, and in addition to the measurements of the coercive voltage distribution and other electrical behavior, the time duration between the write and read pulses can be selected, and varied if desired, to characterize the extent of relaxation effects, and thus to define the equations used to model relaxation in ferroelectric capacitor 10 as described above relative to FIG. 8. In summary, the relaxation effect is modeled by way of a time-dependent relaxation function r(t) for a given gridcell $25_k$ as:

$$r(t) = \frac{n_i(t)}{n_{io}}$$

in which $n_i(t)$ represents the number of domains remaining polarized after relaxation time t:

$$n_i(t) = n_{min} + (n_{io} - n_{min})e^{-w_i t}$$

where $n_{io}$ is the number of polarizable domains 15 within gridcell $25_k$, and $n_{min}$ is the minimum number of polarized domains remaining polarized after an arbitrarily long relaxation time t. As described above, the exponential term $w_i$ is a relaxation time constant that is constructed to reflect the dependence of relaxation on coercive voltage:

$$w_i = \lambda e^{-\frac{V_i^2}{V_{sc}^2}}$$

where $\lambda$ is a curve-fitting constant, and where $V_i$ is the applicable coercive voltage $V_\alpha$ and $V_\beta$ for gridcell $25_i$, depending on the current polarization state of domains 15 associated with that gridcell $25_i$ ($V_i = V_\alpha$ for domains in the "+1" state, and $V_i = V_\beta$ for domains in the "−1" state), and where $V_{sc}$ represents the transition voltage range at the coercive voltages, as described above. It is contemplated that the curve-fitting parameter $\lambda$ and the asymptotic domain numbers may be determined by electrical characterization of the test ferroelectric capacitors by varying the timing of the write and read pulses, as carried out in connection with measurement process 74. This relaxation effect can then be included in the polarization summation over all gridcells 25.

Upon acquiring the desired measurement data from process 74, for one or more samples of the test ferroelectric capacitors manufactured in process 70, modeling and simulation system 50 can then execute process 76 to calibrate the nominal model defined in process 72 to correspond to the measured polarization parameters observed in process 74. The resulting calibrated model can then be stored in memory, for example in data memory 57 or in library 62 of system 50 (FIG. 10).

The method illustrated in FIG. 11a is based on the electrical measurement of test ferroelectric capacitors shortly after manufacture and thus corresponds to a "time-zero" model of ferroelectric capacitor 10, from the standpoint of use of the ferroelectric capacitors. However, as described above relative to FIGS. 6a and 6b, the changes in this probability distribution function from a time-zero function to an end-of-life function can be substantial. As described above, the model of ferroelectric capacitor 10 according to embodiments of this invention has the capability of modeling the effects of imprint by adjustment of the probability distribution function of the coercive voltages, and thus the weighting function W upon which the model polarization summation is based. FIG. 11b illustrates an example of a method of defining the end-of-life probability distribution function, as will now be described.

In process 80, one or more of the test ferroelectric capacitors manufactured in process 70 are subjected to stress conditions that accelerate the effects of imprint and other applicable "wear-out" mechanisms. As mentioned above, and as known in the art, the effects of imprint occur over time (static imprint), and over a number of write cycles (dynamic imprint). It is believed, by those skilled in the art, that these effects are activation mechanisms, and as such the observable effects of these mechanisms can be accelerated by subjecting the devices to elevated temperature. For example, the effects of imprint on the probability distribution function of coercive voltages can be emulated, in process 80, by subjecting the test ferroelectric capacitors to a high temperature (e.g., 125 deg C.) bake, with or without an applied bias. Following the bake or other accelerated stress applied in process 80, the electrical characteristics of the stressed test ferroelectric capacitors are measured in process 82, for example by way of a similar process as described above relative to process 74. It has been observed, in connection with this invention, that both the polarization characteristic and also the relaxation behavior degrade as a result of imprint, and that therefore the end-of-life model can convey both changes in the probability distribution function and also changes in the relaxation effect. Modeling and simulation system 50 uses these observed polarization measurements in process 83, to define the probability distribution function of the coercive voltages, including the effects of correlation between these voltages.

In process 84, as in process 76 described above, modeling and simulation system 50 calibrates the nominal model for ferroelectric capacitor 10 to match the measured post-stress electrical behavior. The nominal model that is calibrated in process 76 can be the original nominal mode defined in process 72 and stored within the memory resources of modeling and simulation system 50, or alternatively may be a calibrated time-zero model previously created in an instance of process 78 (FIG. 11a). In process 86, modeling and simulation system 50 stores this calibrated end-of-life model for ferroelectric capacitor 10 in its memory resources (e.g., data memory 57 or library 62, in the system of FIG. 10).

It is contemplated that models of ferroelectric capacitor 10 may be generated by way of interpolation of the probability distribution functions between the time-zero model stored in process 78 and the end-of-life model stored in process 86. Such interpolated models may be useful in simulating a ferroelectric capacitor 10 in "mid-life".

Evaluation of Circuit Behavior

Following the generation of either or both of time-zero and end-of-life models, stored in processes 78, 86, the simulation of electronic circuits including ferroelectric capacitor 10 can now be carried out. Those skilled in the art with familiarity with SPICE or other computer-based electronic circuit simulation programs or packages, and having reference to this specification, will be readily able to apply the models of ferroelectric capacitor 10 produced in the manner described above to simulate the behavior of such devices and circuits in a wide variety of conditions, and in a wide variety of circuit applications. For example, ferroelectric capacitor 10 may serve as a capacitor in an analog circuit, in which the small-signal behavior of ferroelectric capacitor 10 after being polarized into one state or the other is simulated.

An example of a generalized method of operating modeling and simulation system 50 in executing such simulations will now be described in connection with FIG. 12. Those skilled in the art having reference to this specification will readily recognize a wide range of alternatives and variations to the operation of system 50 as described herein. In addition, it is contemplated that each of the process steps performed in connection with this description of the operation of system 50 will be executed, under either user or program control, by the appropriate functions and components of system 50, depending on the particular architecture. More specifically, it is contemplated that this operation of system 50 will be performed by central processing unit 55 or such other component in system 50 in the execution of program instructions stored in program memory 54 or in some other memory resource of system 50. It is of course contemplated that the specific manner in which system 50 performs these operations can be defined by those skilled in the art having reference to this specification, as appropriate for the particular architecture of system 50 and the desired interface between system 50 and the human user.

As known in the art for SPICE and similar simulation environments, the simulation of an electronic circuit including ferroelectric capacitor 10 is based on a set of circuit elements that are associated with selected "nodes" in an overall "netlist" that specifies the circuit being simulated. Each circuit element is specified by a model, which specifies the simulated behavior of the circuit element in response to stimuli applied to that circuit element at its nodes; some nodes in the circuit will serve as inputs to the circuit being simulated, while other nodes will serve as the "output" nodes, namely as the nodes under investigation by the simulation in response to the stimuli applied at the input nodes. In addition, initial conditions may be applied at certain nodes, particularly in simulating the transient response of the circuit being simulated.

Figure 12:
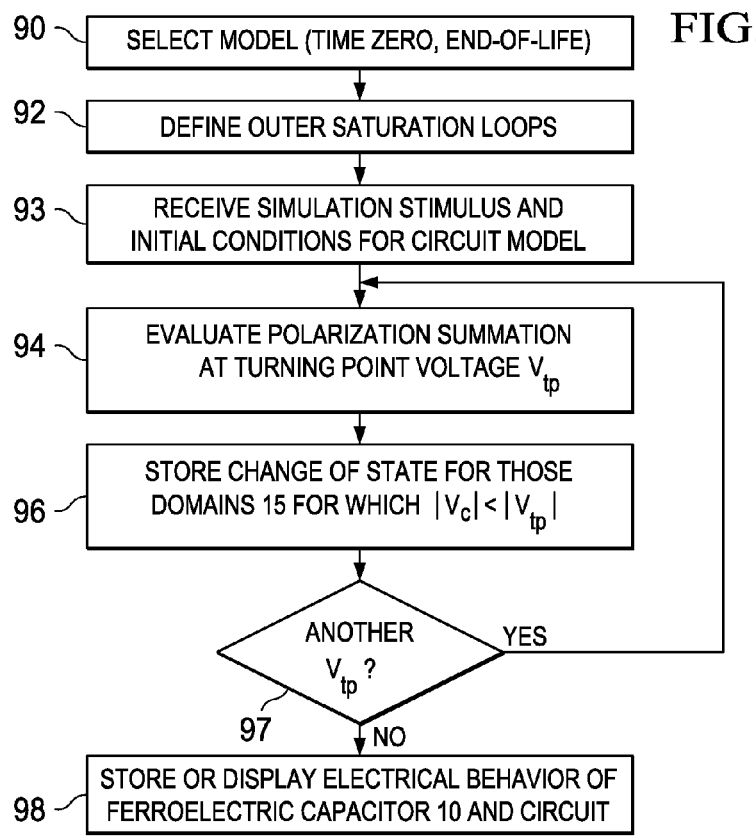
FIG. 12 is a flow diagram illustrating the operation of the computer system in simulating an electronic circuit including a ferroelectric capacitor, according to embodiments of the invention.

For purposes of this description in connection with FIG. 12, it is contemplated that it is the behavior of ferroelectric capacitor 10 that is of interest. As such, either one or more of the nodes assigned to ferroelectric capacitor 10 will serve as the output nodes for the simulation, or alternatively circuitry coupled to ferroelectric capacitor 10 will be assigned to the output nodes. For the example of the FRAM memory cell shown in FIG. 3a, a sense amplifier or other circuit may be coupled to bit line BL, and the response of that sense amplifier to voltages applied or forwarded to word line WL and drive line DL of memory cell 8 may be the output node of interest. In each case, it is the polarization response of ferroelectric capacitor 10, made manifest by the charge stored by ferroelectric capacitor 10 in response to applied voltage, that is of interest in the simulation.

Referring back to FIG. 12, in process 90 the appropriate model for ferroelectric capacitor 10 is selected. As described above, different models for ferroelectric capacitor 10 may be generated to model the behavior of ferroelectric capacitor 10 either at time-zero (shortly after manufacture) or near the end of its useful life (i.e., including the effects of imprint).

Once the model is selected in process 90, the outer saturation loops are defined in process 92. The particular construction of ferroelectric capacitor 10 determines certain parameters in the modeled polarization characteristic, as well as certain parameters in the non-polarization-dependent performance of the device. Once these parameters are received or input, the outer saturation loops of the modeled ferroelectric capacitor 10 can be defined, in process 92. In the case of simulating an FRAM cell, for example, the effects of a "write" operation can be simulated by applying a sufficiently high amplitude write pulse to the nodes of modeled ferroelectric capacitor 10, either by way of a write circuit being simulated or by simply setting the plate voltages of ferroelectric capacitor 10 accordingly.

According to this embodiment of the invention, as described above, the model of ferroelectric capacitor 10 is capable of comprehending applied voltages that are between the positive and negative coercive voltages, and thus capable of evaluating "minor loops" in the polarization characteristic. Such minor loop evaluation requires consideration of the initial "full" polarization state indicated by the outer saturation loops, but also the history of lower amplitude voltages applied to the nodes of ferroelectric capacitor 10. This simulation of the response of ferroelectric capacitor 10 is carried out beginning with process 93, in which the simulation program executed by system 50 reads the simulated stimulus levels and initial conditions for the modeled electronic circuit, whether as a DC level or as a sequence of applied voltages over time. As described above, minor loops in the polarization characteristic are encountered upon the voltage applied to ferroelectric capacitor 10 changing direction (i.e., the rate of change dV/dt changes polarity). If the applied voltage changes direction at a voltage less than the saturation coercive voltages, that applied voltage constitutes a "turning point" voltage, and defines a minor loop in the polarization characteristic. In process 94, the model of ferroelectric capacitor 10 is evaluated at such a turning point voltage $V_{Tp}$, by evaluating the polarization summation for multi-domain ferroelectric capacitor 14 over the n gridcells, at the voltage $V_{Tp}$, and for the current polarization state $X_k$ of each domain 15 associated with each of the m gridcells:

$$Q = \sum_{k=0}^{m-1} Q_k(V_{Tp}, X_k) W_k(V_\alpha(k), V_\beta(k))$$

where $W_k(V, \alpha, \beta)$ is a weighting function corresponding to the number of domains 15 that have coercive voltage levels $V_\alpha(k)$ and $V_\beta(k)$ within a given gridcell $25_k$, in process 94. The charge $Q_k$ for each domain 15 (i.e., each gridcell 25, weighted by the number of domains 15 in that gridcell 25 indicated by the weighting function) is defined, in this embodiment of the invention, by the state-dependent equations:

$$Q_k = \theta_{-1} \cdot r(t) \cdot \tanh\left(2\frac{V - V_\alpha(k)}{V_{sc}}\right), \text{ for } V < V_\alpha(k)$$

and $$Q_k = \theta_{-1}\left[1 - \frac{(V - V_\alpha(k) - V_{sc})^2}{V_{sc}^2}\right], \text{ for } V \geq V_\alpha(k)$$

for the "−1" state, and $$Q_k = \theta_{+1} \cdot r(t) \cdot \tanh\left(2\frac{V - V_\beta(k)}{V_{sc}}\right), \text{ for } V > V_\beta(k)$$

and $$Q_k = \theta_{+1}\left[1 - \frac{(V - V_\beta(k) - V_{sc})^2}{V_{sc}^2}\right], \text{ for } V \leq V_\beta(k)$$

for the "+1" state. As evident from these expressions, and as described above, relaxation effects are incorporated into the polarization equation by way of the r(t) term in the tan h term; as such, evaluation process 94 can also receive an input t corresponding to a relaxation time during which ferroelectric capacitor 10 received no applied voltage. This relaxation time t depends on the particular simulation stimuli sequence, of course. The resulting polarization characteristic for multi-domain ferroelectric capacitor 10, from process 94, is combined with the electrical behavior of non-polarizing capacitor 12 (FIG. 3b) and any other model components included within the overall model of ferroelectric capacitor 10, to evaluate the electrical state of ferroelectric capacitor 10 in response to the simulated stimulus.

Following the evaluation of the electrical state of ferroelectric capacitor 10 at turning point voltage $V_{Tp}$ in process 94, some of the domains 15 in the model of multi-domain ferroelectric capacitor 14 will change state in response to the applied voltage level of processes 93, 94. In particular, those domains 15 associated with the gridcells 25 in which the turning point voltage $V_{Tp}$ exceeds either the positive or negative coercive voltage, as the case may be. Modeling and simulation system 50 comprehends those domains 15 that change state as a result of the applied voltage $V_{Tp}$, and stores the change of state for those domains 15 in data memory 57, in process 96.

The input stimuli and response of ferroelectric capacitor 10 can correspond to a sequence of voltages, in which the voltage applied to ferroelectric capacitor 10 is varied within the range of saturation voltages of ferroelectric capacitor 10. If another "turning point" voltage is encountered in this sequence of applied voltage (decision 97 is "yes"), then evaluation process 94 is performed again to evaluate the polarization summation of multi-domain ferroelectric capacitor 14 at this new voltage, including the electrical evaluation of ferroelectric capacitor 10 as a whole if desired, with any changes in the polarization state of domains 15 within multi-domain ferroelectric capacitor 14 stored in process 96. This process continues throughout the sequence of simulated applied voltages to ferroelectric capacitor 10.

Upon the end of the simulated stimuli applied to ferroelectric capacitor 10 (decision 97 is "no"), modeling and simulation system 50 then stores or displays the results of the simulation, in process 98. As known in the art for SPICE and similar simulation environments, the manner in which the output of a simulation is presented or otherwise managed is determined by user configuration or input. For example, a common output from a SPICE simulation is a plot of signal levels at the selected output nodes over a time interval, either as displayed on a graphics display of workstation 51 or output by way of a printed hard copy, or both. Alternatively, or in addition, the result of the simulation performed in the manner illustrated in FIG. 12 can be stored in library 62 for later use, comparison, or analysis in the conventional manner.

In Conclusion

Embodiments of this invention provide many advantages useful in the design and manufacture of integrated circuits that include ferroelectric capacitors or other ferroelectric devices. According to this invention, the accuracy of the models used in simulation of such circuits is substantially improved over conventional ferroelectric capacitor models. Minor loops in the polarization characteristic are not constrained, in shape or otherwise, by the shape of outer saturation loops, but rather can readily follow the characteristics as measured from live devices, whatever that behavior may be. As such, the polarization characteristic applied to this mode corresponds to the physical behavior of measured devices, rather than to an a priori mathematical expression of that behavior. In addition, many degrees of freedom are available in the definition of the ferroelectric capacitor behavior, through the use of a weighting function defined by a probability distribution function of coercive voltage levels over a large number of modeled domains. Degradation of ferroelectric capacitor behavior over operating life can also be readily represented and applied to the model through modifications of the probability distribution function. In addition, the effects of relaxation can also be accurately and easily incorporated into the model. As such, the embodiments of this invention enable the derivation and use of an accurate and efficient model for the complex behavior of ferroelectric elements in integrated circuits, in a manner that contemplates degradation over time.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of creating a model of a ferroelectric capacitor for use in a computerized simulation of an electronic circuit including a ferroelectric capacitor, comprising the steps of:
   measuring polarization behavior of at least one ferroelectric capacitor;
   from the measured polarization behavior, deriving a probability distribution function of positive and negative coercive voltages at which domains of the ferroelectric capacitor are polarized into polarization states; and
   combining a weighting function based on the probability distribution function with a polarization versus voltage expression for each of a plurality of model polarizable domains, to define a polarization summation expression of the overall polarization of the modeled ferroelectric capacitor.

2. The method of claim 1, wherein the combining step comprises:
   retrieving a nominal model of a ferroelectric capacitor from a memory resource in a computer system; and
   calibrating the nominal model using the derived probability distribution function.

3. The method of claim 1, further comprising:
   before the measuring step, applying a stress condition to the at least one ferroelectric capacitor.

4. The method of claim 1, further comprising:
from the measured polarization behavior, deriving a time-dependent function of loss of polarization;
and wherein the combining step also combines the time-dependent function with the weighting function and the polarization versus voltage expression.

5. A method of executing a computer system to simulate the behavior of an electronic circuit including a ferroelectric capacitor, comprising the steps of:
retrieving using said computer system a model of the ferroelectric capacitor, the model representing the ferroelectric capacitor as a plurality of independent polarizable domains, each domain having a positive coercive voltage and a negative coercive voltage, the model defining a probability distribution function of the plurality of domains over a range of positive and negative coercive voltages, each domain associated with a polarization characteristic equation by way of which its polarization can be evaluated as a function of applied voltage and polarization state;
assigning using said computer system circuit nodes to the ferroelectric capacitor model;
for an assigned stimulus at the assigned circuit nodes, summing the polarization over the plurality of domains evaluated at the assigned stimulus, to determine using said computer system the polarization of the modeled ferroelectric capacitor in response to the assigned stimulus; and
generating an output based on the polarization from the summing step.

6. The method of claim 5, wherein each of the domains is associated with a gridcell of a numerical grid of positive and negative coercive voltage values, the association based on the positive and negative coercive voltages of the domain;
wherein the polarization characteristic of the plurality of domains corresponds to a combination of a polarization characteristic equation for a single domain, multiplied by a weighting function defined by the probability distribution function;
and wherein the summing step comprises summing the polarization characteristic of each gridcell over the plurality of domains evaluated at the assigned stimulus.

7. The method of claim 6, wherein the polarization characteristic equation includes a time-dependent relaxation factor;
wherein the assigned stimulus comprises an elapsed time without bias;
and wherein the summing step sums the polarization over the plurality of domains evaluated at the assigned stimulus and elapsed time.

8. The method of claim 5, wherein the assigned stimulus comprises at least one applied voltage to the modeled ferroelectric capacitor beyond a saturation level of at least one of the positive and negative coercive voltages, so that all domains are polarized to a polarization state.

9. The method of claim 8, further comprising:
then storing, in memory, the polarization state of each of the plurality of domains;
then, for a second assigned stimulus at the circuit nodes, summing the polarization over the plurality of domains evaluated at the second assigned stimulus, to determine the polarization of the modeled ferroelectric capacitor in response to the second assigned stimulus and for the stored polarization state; and
then storing, in memory, the polarization state of each of the plurality of domains from the step of summing the polarization over the plurality of domains evaluated at the second assigned stimulus;
wherein the step of generating an output generates the output based on the polarization from the step of summing the polarization over the plurality of domains evaluated at the second assigned stimulus.

10. The method of claim 9, wherein the second assigned stimulus comprises at least one applied voltage to the modeled ferroelectric capacitor between saturation levels of the positive and negative coercive voltages.

11. The method of claim 10, wherein each of the domains is associated with a gridcell of a numerical grid of positive and negative coercive voltage values, the association based on the positive and negative coercive voltages of the domain;
wherein the polarization characteristic of the plurality of domains corresponds to a combination of a polarization characteristic equation for a single domain, multiplied by a weighting function defined by the probability distribution function;
and wherein each of the summing step comprises summing the polarization characteristic of each gridcell over the plurality of domains evaluated at the assigned stimulus.

12. The method of claim 5, wherein the probability distribution function of the plurality of domains over a range of positive and negative coercive voltages corresponds to behavior of a measured ferroelectric capacitor shortly after manufacture.

13. The method of claim 5, wherein the probability distribution function of the plurality of domains over a range of positive and negative coercive voltages corresponds to behavior of a measured ferroelectric capacitor after application of an accelerated stress condition.

14. The method of claim 5, wherein the electronic circuit including a ferroelectric capacitor corresponds to a circuit in a ferroelectric memory device.

15. The method of claim 5, wherein the electronic circuit including a ferroelectric capacitor corresponds to an analog circuit;
and wherein the assigned stimulus corresponds to small-signal variations in voltage applied to the ferroelectric capacitor.

16. A non-transitory computer-readable medium storing a computer program that, when executed on a computer system, causes the computer system to perform a sequence of operations for simulating the behavior of an electronic circuit including a ferroelectric capacitor, the sequence of operations comprising:
retrieving a model of the ferroelectric capacitor, the model representing the ferroelectric capacitor as a plurality of independent polarizable domains, each domain having a positive coercive voltage and a negative coercive voltage, the model defining a probability distribution function of the plurality of domains over a range of positive and negative coercive voltages, each domain associated with a polarization characteristic equation by way of which its polarization can be evaluated as a function of applied voltage and polarization state;
assigning circuit nodes to the ferroelectric capacitor model;
for an assigned stimulus at the circuit nodes, summing the polarization over the plurality of domains evaluated at the assigned stimulus, to determine the polarization of the modeled ferroelectric capacitor in response to the assigned stimulus; and
generating an output based on the polarization from the summing step.

17. The medium of claim 16, wherein each of the domains is associated with a gridcell of a numerical grid of positive and negative coercive voltage values, the association based on the positive and negative coercive voltages of the domain;

wherein the polarization characteristic of the plurality of domains corresponds to a combination of a polarization characteristic equation for a single domain, multiplied by a weighting function defined by the probability distribution function;

and wherein the summing operation comprises summing the polarization characteristic of each gridcell over the plurality of domains evaluated at the assigned stimulus.

18. The medium of claim 17, wherein the polarization characteristic equation includes a time-dependent relaxation factor;

wherein the assigned stimulus comprises an elapsed time without bias;

and wherein the summing step sums the polarization over the plurality of domains evaluated at the assigned stimulus and elapsed time.

19. The medium of claim 16, wherein the assigned stimulus comprises at least one applied voltage to the modeled ferroelectric capacitor beyond a saturation level of at least one of the positive and negative coercive voltages, so that all domains are polarized to a polarization state;

wherein the sequence of operations further comprises:

then storing, in memory, the polarization state of each of the plurality of domains;

then, for a second assigned stimulus comprising at least one voltage applied to the modeled ferroelectric capacitor that is between saturation levels of the positive and negative coercive voltages, summing the polarization over the plurality of domains evaluated at the second assigned stimulus, to determine the polarization of the modeled ferroelectric capacitor in response to the second assigned stimulus and for the stored polarization state; and then storing, in memory, the polarization state of each of the plurality of domains from the step of summing the polarization over the plurality of domains evaluated at the second assigned stimulus;

and wherein the operation of generating an output generates the output based on the polarization from the step of summing the polarization over the plurality of domains evaluated at the second assigned stimulus.

20. The medium of claim 19, wherein each of the domains is associated with a gridcell of a numerical grid of positive and negative coercive voltage values, the association based on the positive and negative coercive voltages of the domain;

wherein the polarization characteristic of the plurality of domains corresponds to a combination of a polarization characteristic equation for a single domain, multiplied by a weighting function defined by the probability distribution function;

and wherein each of the summing operations comprises summing the polarization characteristic of each gridcell over the plurality of domains evaluated at the assigned stimulus.

21. The medium of claim 16, wherein the probability distribution function of the plurality of domains over a range of positive and negative coercive voltages corresponds to behavior of a measured ferroelectric capacitor shortly after manufacture.

22. The medium of claim 16, wherein the probability distribution function of the plurality of domains over a range of positive and negative coercive voltages corresponds to behavior of a measured ferroelectric capacitor after application of an accelerated stress condition.

* * * * *